United States Patent

Nishio et al.

Patent Number: 5,868,806
Date of Patent: Feb. 9, 1999

[54] ABRASIVE TAPE AND METHOD OF PRODUCING THE SAME

[75] Inventors: Toshikazu Nishio; Hiroyuki Amemiya; Yasuo Nakai; Taiji Ishii; Masahisa Yamaguchi, all of Tokyo, Japan

[73] Assignee: Dai Nippon Printing Co., Ltd., Japan

[21] Appl. No.: 911,053

[22] Filed: Aug. 14, 1997

Related U.S. Application Data

[62] Division of Ser. No. 379,459, Mar. 22, 1995, Pat. No. 5,709,598.

[30] Foreign Application Priority Data

Jun. 2, 1993 [WO] WIPO ............ PCT/JP93/00743

[51] Int. Cl.⁶ ........................... B24D 11/00
[52] U.S. Cl. ............... 51/297; 51/298; 451/530; 451/526; 451/533; 451/534; 451/539
[58] Field of Search ............ 51/297, 298; 451/526, 451/530, 533, 534, 539

[56] References Cited

U.S. PATENT DOCUMENTS

| | | | |
|---|---|---|---|
| 794,495 | 7/1905 | Gorton | 451/530 |
| 2,242,877 | 3/1941 | Albertson | 451/527 |
| 2,292,261 | 2/1942 | Albertson | 451/527 |
| 3,401,491 | 9/1968 | Schnabel et al. | 51/295 |
| 4,047,903 | 9/1977 | Hesse et al. | 51/298 R |
| 4,111,666 | 9/1978 | Kalbow | 451/527 |
| 4,202,140 | 5/1980 | Alessio | 451/527 |
| 4,457,766 | 7/1984 | Caul | 51/298 |
| 4,576,850 | 3/1986 | Martens | 428/156 |
| 4,587,291 | 5/1986 | Gardziella et al. | 524/595 |
| 4,642,126 | 2/1987 | Zador et al. | 51/295 |
| 4,652,274 | 3/1987 | Boettcher et al. | 51/298 |
| 4,735,632 | 4/1988 | Oxman | 51/295 |
| 4,751,138 | 6/1988 | Tumey et al. | 428/323 |
| 4,881,999 | 11/1989 | Balmer et al. | 156/231 |
| 4,903,440 | 2/1990 | Larson et al. | 51/298 |
| 4,930,266 | 6/1990 | Calhoun et al. | 51/293 |
| 5,011,513 | 4/1991 | Zador et al. | 51/295 |
| 5,014,468 | 5/1991 | Ravipati et al. | 51/295 |
| 5,015,266 | 5/1991 | Yamamoto | 51/293 |
| 5,089,330 | 2/1992 | Sato et al. | 428/323 |
| 5,152,917 | 10/1992 | Pieper et al. | 51/295 |
| 5,219,462 | 6/1993 | Bruxvoort et al. | 51/293 |
| 5,709,598 | 1/1998 | Nishio et al. | 451/530 |
| 5,711,772 | 1/1998 | Ryoke et al. | 51/295 |

FOREIGN PATENT DOCUMENTS

| | | |
|---|---|---|
| 2009718 | 9/1990 | Canada . |
| 62-255069 | 4/1986 | Japan . |
| 63-293099 | of 1989 | Japan . |
| 1-171771 | 7/1989 | Japan . |
| 2-83172 | 3/1990 | Japan . |
| 2-256467 | 10/1990 | Japan . |
| 5-098049 | of 1993 | Japan . |
| WO 92/15626 | 3/1991 | WIPO . |
| WO 93/13912 | 1/1992 | WIPO . |
| WO 94/20264 | 3/1993 | WIPO . |

*Primary Examiner*—Deborah Jones
*Attorney, Agent, or Firm*—Parkhurst & Wendel, L.L.P.

[57] ABSTRACT

For producing an abrasive tape (11) including a film substrate (2) and a polishing abrasive layer (10) laminated on one surface of the film substrate (2) and having on the outer surface thereof a plurality of recessed parts (9), the film substrate (2) is wrapped partially around the outer peripheral surface of a roll formplate (1) having on the surface thereof a plurality of concavities (5), and, as the roll formplate (1) is rotated, the film substrate (2) is fed thereto. On one hand, an ionizing radiation curing type resin (3) is supplied into the interface between the roll formplate (1) and the film substrate (2) therearound to be formed by the concavities (5), and the recessed parts (9) are formed on the resin surface. During this forming, radiation rays (R) are projected from an ionizing radiation ray source (8) toward the resin (3) thereby to cure the resin (3) and, at the same time, to render the resin (3) and the film substrate (2) into an integral structure. The abrasive tape (11) obtained in this manner is separated from the roll formplate (1). The abrasive tape (11) thus obtained is of high product quality. The production method is highly efficient and is suitable for mass production of abrasive tapes of identical concave-convex surface figuration.

2 Claims, 17 Drawing Sheets

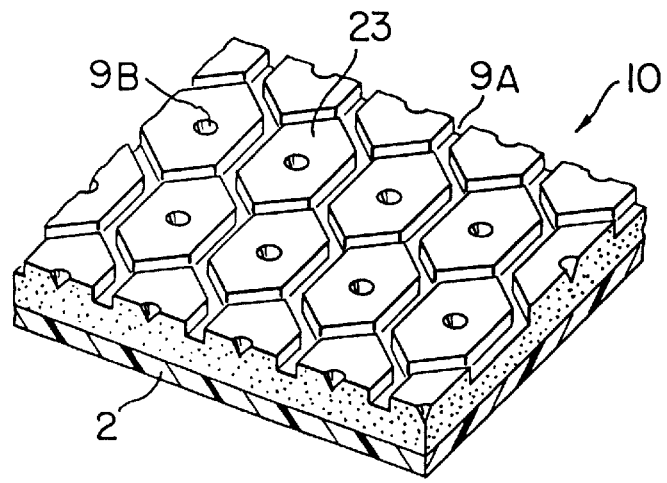
F I G. 21
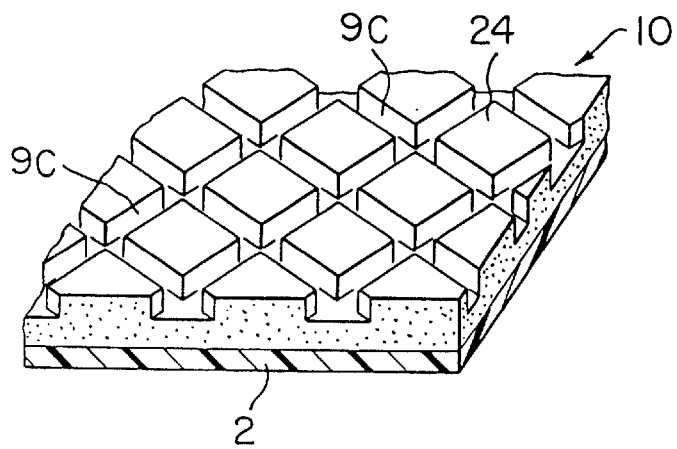
F I G. 22
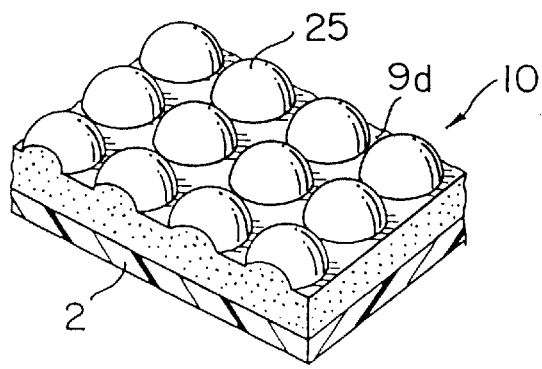
F I G. 23

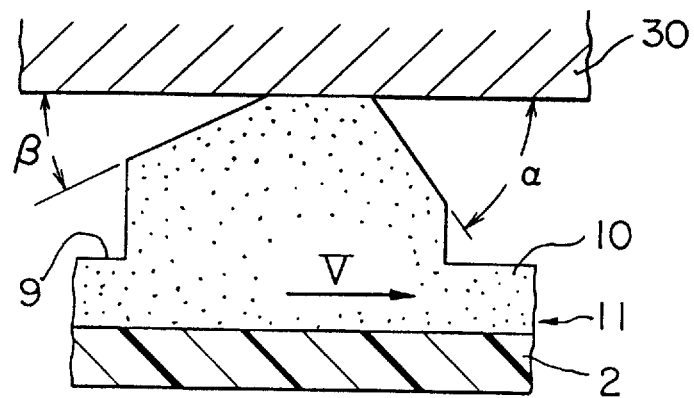
F I G. 26
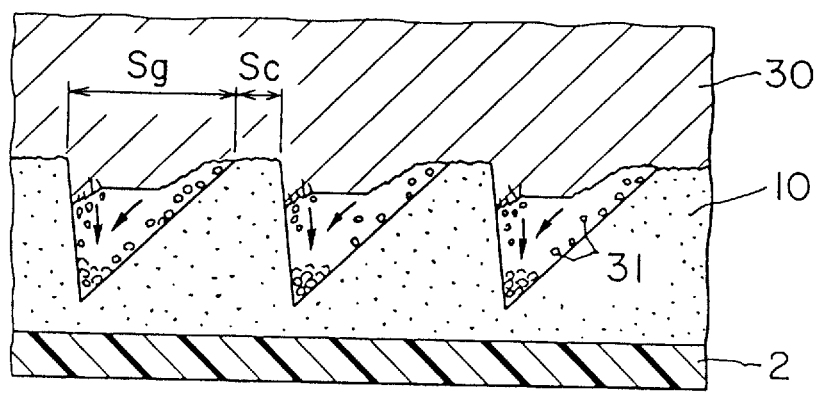
F I G. 27

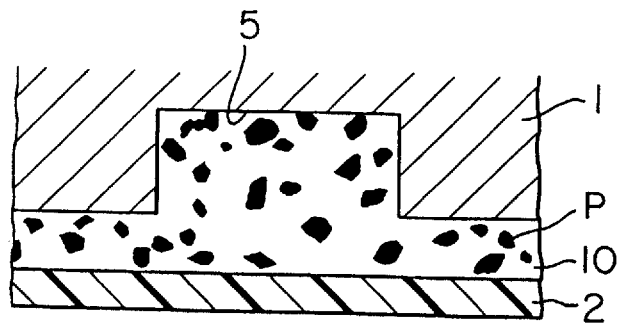
F I G. 31
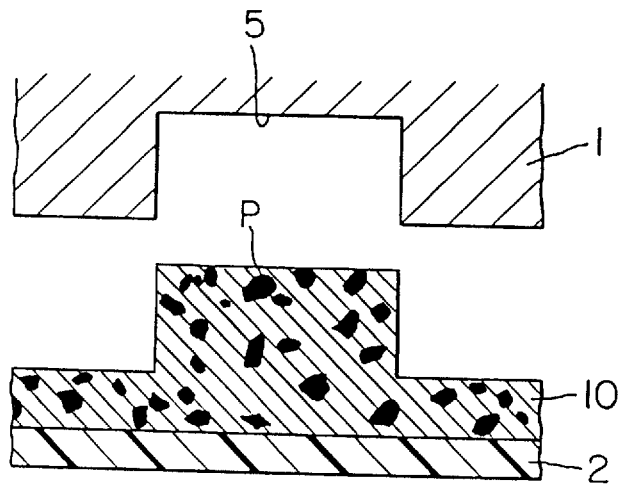
F I G. 32
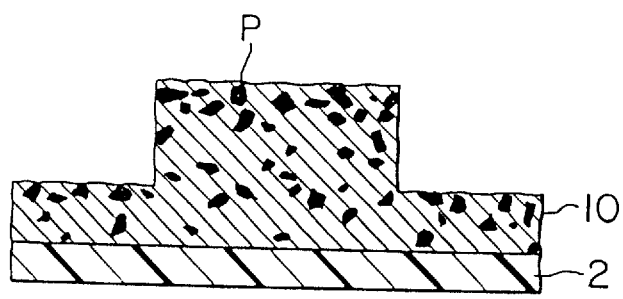
F I G. 33

ABRASIVE TAPE AND METHOD OF PRODUCING THE SAME

This is a division of application Ser. No. 08/379,459 filed Mar. 22, 1995, now U.S. Pat. No. 5,709,598.

TECHNICAL FIELD

The present invention relates to an abrasive tape for finish lapping or polishing with high precision to a mirror-surface finish such surfaces as those of floppy disks, magnetic heads, precision electronic components, and end surfaces of optical fibers. The invention relates also to a method of producing the abrasive tape.

BACKGROUND ART

As abrasive tapes of the above stated kind, in general, there are those of a structural organization wherein, on a substrate material, a coating comprising a polishing abrasive material and a binder component is applied to form a polishing film. An abrasive tape of this character has a simple structural organization and can be readily produced. During its use, however, debris formed from the workpiece being polished tends to infiltrate between the abrasive polishing film of the abrasive tape and the workpiece. If the polishing process is continued in this state, the surface of the workpiece will be damaged by this polishing debris, or the polishing debris will adhere to the film surface and cause its pores or recesses to become clogged. As a result, the polishing capacity of the abrasive tape has dropped considerably heretofore.

Furthermore, an abrasive tape provided with grooves in its polishing layer has been proposed. In the process of forming the polishing layer of this tape, a paint containing a large quantity of an inorganic ingredient in a coating compound is applied. Then the concavities and convexities of the Bernard cell due a "convection cell phenomenon" which occurs in the coating layer at the time when the solvent is dried are utilized as groove forms of the polishing layer. (Reference: Japanese Pat. Laid-Open Publn. No. 62-255069.) In the case of this abrasive tape, however, the shape as viewed in plan view of the grooved parts thus formed becomes restricted to an approximately hexagonal shape for reasons due to the production method. Moreover, it has been difficult to form recesses consistently of the same pattern, and products of stable quality could not be easily obtained. Furthermore, the control of conditions such as the composition of the solvent of the coating material for forming the polishing layer, the coating quantity, and the drying conditions in the production process for uniformity and stabilization of the pattern of the grooved parts to be thus formed has been difficult. Consequently, there has been the problem of extremely complicated production procedures. Furthermore, the concavities and convexities that can be formed on this abrasive tape is limited, in terms of the number of the polishing abrasive, to between #6,000 and #7,000 measured according to JIS R 6001. Polishing abrasives of numbers higher than this (i.e., concavities and convexities of dimensions less than this) could not be obtained.

Furthermore, in the method described in the above mentioned Japanese Pat. Laid-Open Publn. No. 62-255069 and other known methods (Japanese Utility Model Laid-Open Publn. Nos. 55-89564 and 59-39168), the forming of polishing layers into concave-convex pattern forms by using a printing process such as gravure printing and screen printing is disclosed. Furthermore, in Japanese Pat. Laid-Open Publn. No. 2-83172, the forming of a concave/convex pattern by applying a coating of a resin liquid in which polishing abrasive particles have been dispersed on a film substrate and laminating thereon by pressing a film for imparting concavities/convexities is disclosed. By this method, it has not been possible to prevent completely the formation of projections of independent polishing abrasive material on the surface of the polishing layer thus obtained. When such projections are present, the workpiece undergoing polishing is damaged by scratching or scoring. Thus this method becomes unsuitable especially for polishing requiring precision.

Furthermore, because of friction between the abrasive tape and the workpiece being polished, the abrasive tape and the workpiece become electrostatically charged at the time of polishing. For this reason the removal of polishing debris from the polished parts becomes difficult, and residual polishing debris becomes entrapped between the abrasive tape and the workpiece, whereby scratch damage occurs, or dust in the air or polishing debris is adsorbed on the surface after polishing and must be subsequently cleaned off.

Furthermore, depending on the conditions, sparking may occur between the abrasive tape and the workpiece and damage the surface of the workpiece in some cases.

Accordingly, it is an object of the present invention to obtain an abrasive tape of high quality which is capable of solving the above described problems of the prior art.

It is another object of this invention to obtain a novel method by which the above described abrasive tape can be stably produced.

DISCLOSURE OF THE INVENTION

The abrasive tape according to the present invention is characterized in that, in an abrasive tape having a film substrate and an abrasive polishing layer laminated on one surface of the substrate, the polishing layer has on the outer surface thereof a plurality of mutually isolated but adjoining recessed parts each demarcated by being encompassed around the peripheral border thereof by embankment-like convexities.

Furthermore, in the method according to this invention of producing an abrasive tape comprising a film substrate and a polishing layer laminated on one surface thereof and having a plurality of recesses: a formplate having a plurality of concavities for forming said recesses is prepared; of the surface and concavities of this formplate, at least the concavities are filled with a resin of ionizing radiation curing type; the film substrate is caused to contact this ionizing radiation curing type resin; while the film substrate is contacting the ionizing radiation curing type resin, said resin is irradiated with ionizing radiation rays; thus, the resin interposed between the film substrate and the formplate is cured thereby to bond together said resin and the film substrate; and the film substrate and the polishing layer of the cured resin adhering securely thereto and provided with a shape which is complementary to that of the aforementioned concavities are peeled off the aforementioned formplate thereby to obtain an abrasive tape. Thus the abrasive tape is obtained.

According to this invention, an abrasive tape having a polishing layer in which recessed parts that have been formed constantly with faithful replication with respect to the plate concavities of the formplate and with extreme sharpness can be produced. Furthermore, in comparison with the case of forming the recessed parts of the polishing layer by, for example, the thermo-embossing process or the method of using a film for stamping, a high quality product in which the shape of the recessed parts obtained are sharp and exactly as desired can be readily produced. Furthermore, the production process itself is not complicated but is simple and convenient, whereby mass production of stable product quality and high efficiency becomes possible.

According to a desirable mode of practice of the abrasive tape of this invention, the polishing layer comprises a binder of a crosslinked type resin and particles of a polishing material or abrasive grains dispersed therein, and the density of the polishing material particles or grains can be made to increase progressively from the film substrate side to the side of the polishing layer outer surface. By so doing, the distributed density of the polishing material particles or grains, in comparison with that in known polishing tapes which it is substantially uniform from the polishing layer surface to the back surface, is such that the polishing material particle density of the outer surface is higher even with the same added quantity of the polishing material, whereby the polishing capability can be made higher. Furthermore, since the polishing material particles or grains are bonded strongly by the binder of the three-dimensionally crosslinked, ionizing radiation curing type resin, they cannot be easily separated off during polishing. Furthermore, even if the outer layer of the polishing layer is relatively brittle, the bottom layer parts have a lower densities of the polishing material particles or grains and therefore have relatively more flexibility and have toughness. For this reason, the strength of the polishing layer as a whole is secured. Furthermore, since the stresses of the outer layer are absorbed by the bottom layers, even if the polishing layer as a whole is bent or used in a polishing process, it will not fracture or the polishing particles or grains will not separate off.

Furthermore, according to another desirable mode of practice of the abrasive tape of this invention, the polishing layer comprises a binder of a crosslinked type resin and polishing material particles or abrasive grains dispersed therein. Within the three-dimensional network molecular structure of said crosslinked type resin, surface-active agent molecules can be caused to be contained in a state wherein they are chemically combined within said network molecular structure. By this constitutional arrangement, such occurrences as electrostatic charging of the polishing layer during polishing thereby causing adsorption of polishing debris and dust on the polishing layer, contamination of the article being polished, electrical discharging, and scratching or scoring of the article being polished by adsorbed debris, etc., cannot occur. In this connection, there is little possibility of adhesion of the surface active agent or deterioration of the antistatic effect.

Still furthermore, according to a desirable mode of practice of the abrasive tape production method of this invention, the irradiation for complete setting of the binder of the polishing layer is carried out by dividing the irradiation quantity or dosage into two or more doses, whereby the crosslinking curing reaction proceeds by degrees of two or more steps to completion, and in each step of this process, at least one part of the polishing material particles or grains is caused to migrate gradually from the film substrate side to the side of the roll formplate surface. In this connection, moreover, said multistep curing reaction can be carried out in the space or interface confined between the rigid surface of the roll formplate and the film substrate. By this procedure, the outer surface of the polishing layer of the abrasive tape thus obtained will not have outwardly protruding particles, and in addition, even with the same quantity of addition of polishing material, a higher polishing performance can be attained and embrittlement of the polishing layer does not occur in comparison with the case of products obtained by methods known in the prior art.

Furthermore, by the abrasive tape production method of this invention, a polishing layer can be obtained by: dividing the irradiation quantity for fully curing the polishing layer into a plurality of steps; first irradiating that portion of the total irradiation quantity from the first step to an intermediate step through the ionizing radiation curing type resin liquid during the period wherein the film substrate is contacting the roll formplate; permitting the incompletely set resin layer to set to a degree whereby it can be separated from the formplate; then separating the film substrate, together with the incompletely cured resin layer which has been formed with recessed parts, from the roll formplate; and thereafter irradiating the portion of the irradiation quantity of the remaining steps from the side of the incompletely cured resin layer thereby to complete the curing of the ionizing radiation curing type resin layer. By carrying out this process, a polishing layer in which the layer surface has a high crosslinked density and a high degree of hardness, yet ample flexibility being retained, and defects such as cracks, fissures, and separation of the polishing material particles or grains cannot easily occur is obtained.

BRIEF DESCRIPTION OF THE DRAWINGS

FIGS. 21 through 25 are partial perspective views respectively showing various different examples of concave/convex shapes of surfaces of polishing layers of abrasive tapes;

FIG. 26 is an enlarged sectional view indicating a state of polishing of an article by an abrasive tape;

FIG. 27 is a sectional view showing the state of entry of polishing debris into recessed parts of a polishing layer of an abrasive tape at the time of polishing;

FIGS. 31 through 33 are enlarged sectional views indicating successive steps in the process of forming the polishing layer of an abrasive tape;

BEST MODES FOR CARRYING OUT THE INVENTION

Figure 1:
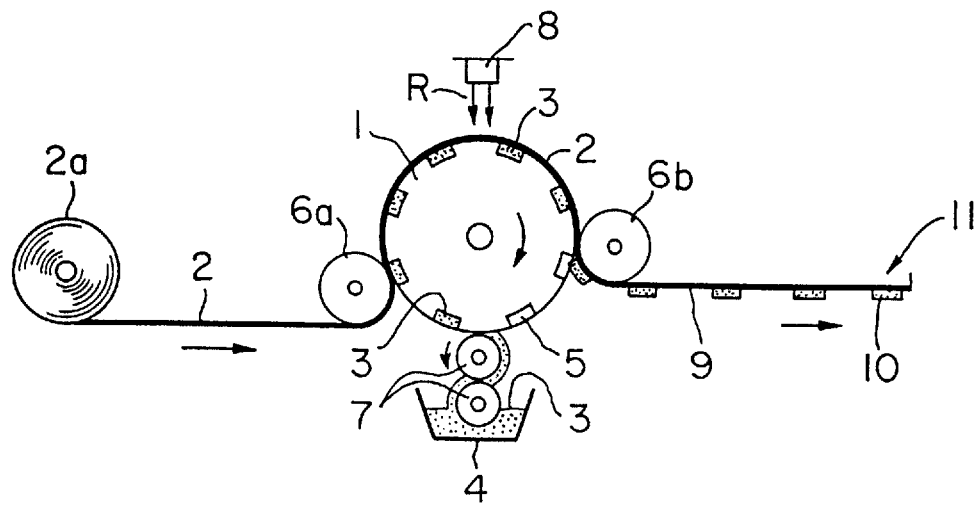
FIG. 1 is a view for describing the fundamental principle of the method of producing the abrasive tape according to the present invention.

FIG. 1 is a view for describing a process indicating one example of practice of the production method of the present invention. In the figure, 1 is a roll formplate (intaglio printing plate). Around the peripheral surface of this roll formplate 1, a film substrate 2 is partially wrapped and is fed in the arrow direction. Below the roll formplate 1, a pan 4 containing an ionizing radiation curable resin containing an abrasive material is provided.

According to the present invention, plate concavities 5 having a shape for imparting shapes of recessed parts to the polishing layer of the abrasive tape are formed on the outer surface of the roll formplate 1. The film substrate 2 is sent from a supply roll 2a, past a pressing roll 6a, to the outer surface of the roll formplate 1 and, passing around a feed-out roll 6b, is fed out. Clearance adjustments, etc., of both rolls with the roll formplate 1 are made possible.

The ionizing radiation curable resin 3 containing an abrasive material is supplied from within the pan 4 by coating rolls 7 so as to fill at least the plate concavities 5. Then, while the substrate 2 is contacting the formplate 1, ionizing radiation rays R are irradiated toward the substrate 2 by an ionizing radiation irradiating device 8 thereby curing the above mentioned resin 3 interposed between the substrate 2 and the formplate 1 and simultaneously causing the same to adhere securely to the side of the substrate 2. Finally, at a feed-out roll 6b, the substrate 2 is peeled off from the formplate 1.

Figure 2:
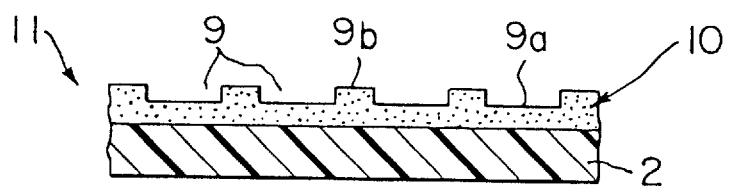
FIG. 2 is a partial sectional view of an abrasive tape obtained by the method of FIG. 1.

By thus peeling the substrate 2 off from the formplate 1, an abrasive tape 11 having on the substrate 2 a polishing abrasive layer 10 provided with recesses 9 formed by the roll formplate 1 as shown in FIG. 2 is obtained. According to this invention, since the forming of the layer 10 having the recesses 9 is carried out by a production method as described above, sharp and clear shapes of the recesses 9 that are faithful reproductions of the shapes profiled on the roll formplate 1 are obtained. Particularly, even in the case where the recesses are of complex and delicate shapes, they can be obtained simply and positively.

According to this invention, furthermore, by so feeding a substrate 2 provided on one surface thereof with the abrasive layer 10 that the other surface thereof, i.e., the surface with no polishing layer formed thereon, contacts the roll formplate 1 and passing the same through the same production process as that described above, abrasive layers 10 of the same kind can be formed on both surfaces of the substrate. In the case where abrasive layers 10 are to be provided on both surfaces of the substrate, furthermore, by installing a second roll formplate on the downstream side in the feed direction of the substrate, and feeding the substrate 2 after it has been peeled off from the first roll formplate directly, as it is, to the second roll formplate, continuous production can be carried out.

Figure 3:
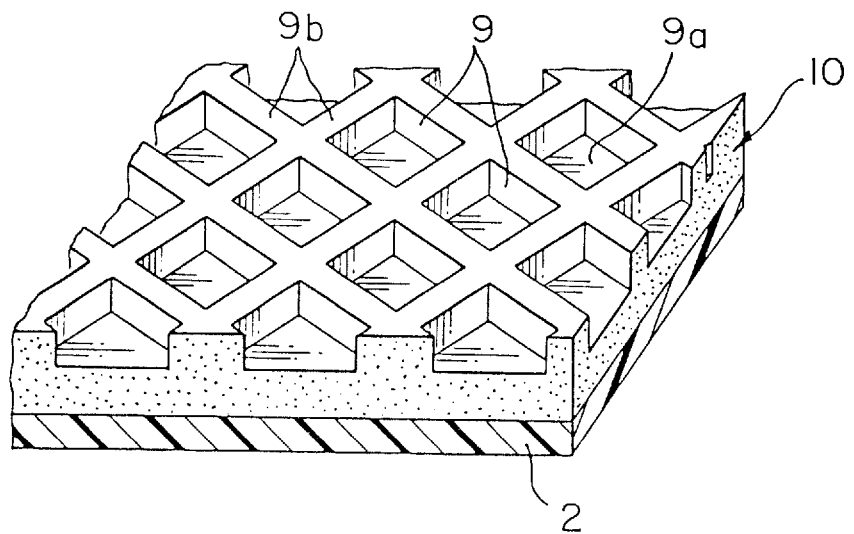
FIG. 3 is a partial perspective view of the abrasive tape of FIG. 2.

As shown in FIG. 3, the abrasive polishing layer 10 of the instant example is of a configuration in which a resin layer part 9a of the polishing layer exists at the bottom of each recess 9. This configuration is so formed that the ionizing radiation curable resin 3 supplied to the plate concavities 5 of the roll formplate 1 will not only be supplied into the plate concavities 5 but will also be interposed between the peripheral surface of the formplate 1 and the substrate 2. In the case where an abrasive layer 10 of a configuration wherein a resin layer part 9a does not exist at the lower part of each recess 9 is to be obtained, a procedure such as scraping away with a doctor blade (not shown) the resin 3 on the formplate surfaces other than the plate concavities 5 is carried out after the resin 3 has been supplied to the roll formplate 1 thereby to carry out adjustment so as to fill only the plate concavities 5 with the curable resin 3. Incidentally, as shown in FIGS. 2 and 3, the recesses 9 are partitioned by banks 9b encompassing the recesses.

The forming of the plate concavities 5 in the roll formplate 1 can be carried out by a method such as electronic engraving, etching, machining on a lathe, milling machine, or the like, electroforming, and sand-blasting. Furthermore, the shape of each plate concavity 5 is a complementary shape of the shape of each recess 9 of the polishing layer, and in actuality, the convex-shaped parts impart recessed shapes. The recesses in the abrasive tape according to this invention carry out the function of accommodating and thereby collecting the polishing debris produced from the workpiece during polishing. In order to make possible efficient accommodation of this polishing debris, it is desirable that the recess 9, in general, have an opening width of 0.1 to 200 $\mu$m, a depth of 0.1 to 100 $\mu$m, and a pitch (spacing of the center parts of adjacent recesses) of 10 to 500 $\mu$m. The capability of accommodating polishing debris in recesses which do not satisfy simultaneously these dimension conditions becomes inadequate. According to this invention, however, the forming of recesses of conditions other than those recited above is of course possible. Furthermore, the recesses 9 are arranged uniformly and regularly over the entire surface of the abrasive layer 10 as illustrated by one example in FIG. 3. In addition, the recesses can be so formed that the shape of each in planar view (in horizontal section) is quadrilateral, hexagonal, circular, elliptical, or some other shape and in vertical section is the shape of an inverted triangle, a rectangle, a semicircle, a trapezoid, or some other figure. That is, the plate concavities 5 are provided with a shape such as to form recesses possessing simultaneously various structural requirements as described above.

For the above mentioned ionizing radiation curable resin, known resins of the type which are cured by irradiation with ultraviolet rays or an electron beam can be used. When, among these (resins), a resin of the type to which no solvent is added is used, undesirable results such as volumetric contraction, deformation, and generation of bubbles due to setting do not occur, and, in addition to a process step of predrying this resin becoming unnecessary, it becomes easier to obtain positively recesses of good reproducibility. Furthermore, among the ionizing radiation rays, ultraviolet rays can be used in the case where the film substrate 2 is transparent. However, in the case where the substrate is opaque, it is necessary to use an electron beam. Furthermore, if the roll formplate is constructed of a material through which ionizing radiation rays can be transmitted, irradiation from an irradiating device installed in the interior of this formplate will become possible. In the case where an electron beam is used, the quantity of irradiation thereof depends on factors such as the thickness and material of the sheet substrate, but ordinarily (an irradiation quantity of) the order of 0.5 to 30 Mrad is desirable.

Figure 4:
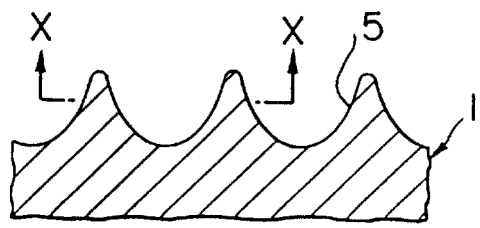
FIG. 4 is a sectional view showing one example of concave parts of a roll formplate.
Figure 5:
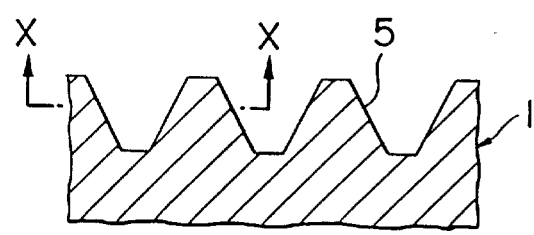
FIG. 5 is a sectional view showing another example of concave parts of a roll formplate.

The shape of the recesses is so designed that, in addition to the requirement for polishing performance of the polishing adhesive layer, the recesses will fulfill also the requirement of suitability for separating of the polishing layer from the roll formplate together with the film substrate. Specifically, a suitable shape of the plate concavities on the roll formplate is such that, as shown in FIGS. 4 and 5, the sectional area of each plate concavity 5 cut by the horizontal sectional plane indicated by line X—X becomes smaller progressively and continuously towards the bottom thereof. For example, when sand-blasting is carried out on a metal plate, a shape of a recess as shown in FIG. 4 is obtained. Furthermore, plate concavities 5 of the shape shown in FIG. 4 can be formed also by forming cells which have been demarcated by halftone dots or multiline screen, etc., through the use of a plate producing method depending on etching of known gravure printing process, during which the widths of the convex parts are made appropriately narrow, and, moreover, amply promoting the side etching of the cell inner walls thereby to remove the portions immediately below the resist.

In addition, plate concavities 5 of a shape as shown in FIG. 4 can also be formed by the aforedescribed machining, and plate concavities 5 of the shape shown in FIG. 4 can also be formed by forming concavities by the aforedescribed etching method and thereafter carrying out sand-blasting.

Figure 6:
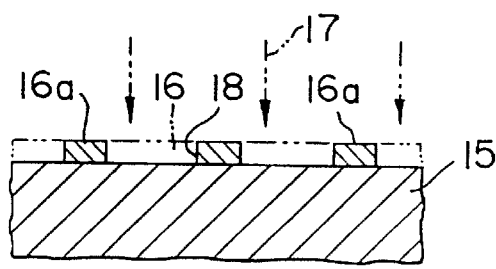
FIGS. 6 through 10 are views sequentially indicating the process steps for forming concave parts of a roll formplate.
Figure 9:
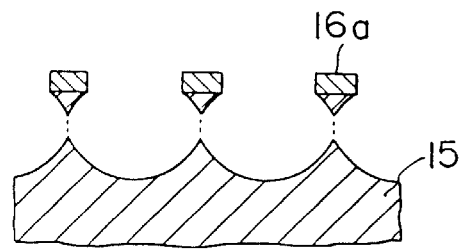
Figure 10:
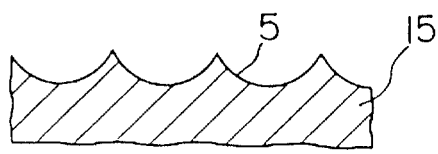

Plate concavities 5 of the shape shown in FIG. 4 can be formed by known photoetching (or photolithographic) methods other than the aforedescribed gravure plate processing method. That is, it is also possible to: lay a photosensitive resist film 16 on a surface of a metal plate 15 as shown in FIG. 6; next, through an original plate (photomask) having the desired concavity shape (whether to be used as a negative or whether to be used as a positive of the concave part pattern, selection is made according to whether the resist is of the negative type or whether it is of the positive type), expose the resist film 16 to light to develop the same; open windows 18 of the desired shape of opening part by leaving a resist pattern 16a; etch the metal within the windows 18 as indicated at 20 in FIG. 7 with a suitable etching solution 19 such as an aqueous solution of ferric chloride ($Fe_2Cl_3$); thereafter cause side etching with the etching solution in the concave parts 20 as indicated at 21 in FIG. 8; and cause side etching to proceed further, whereby, through the state indicated in FIG. 9, plate concavities 5 as shown in FIG. 10 are obtained.

Figure 7:
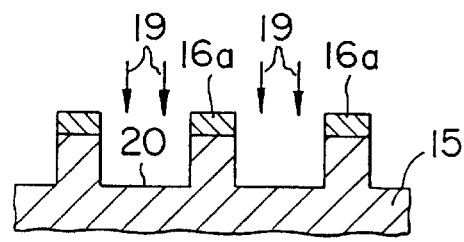

In this operation, however, care must be exercised in controlling the degree of side etching. That is, by restricting the degree of side etching, the forming of the concavities is stopped in the state as shown in FIG. 7. Alternatively, by permitting the side etching to proceed amply, the banks between the concavities are destroyed as indicated in FIG. 9 thereby to obtain the state indicated in FIG. 10.

Figure 8:
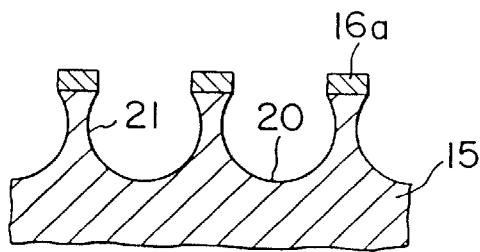

The necessity of peeling the substrate 2 having the polishing layer 10 from the roll formplate 1 as indicated in FIG. 1 has already been mentioned. The polishing layer (cured resin layer) can be so formed that it can be peeled off from the formplate and have concavities in which side etching is negligible as shown in FIG. 7 in the following manner. For the roll formplate, a copper cylinder is used. An aqueous solution of ferric chloride (of a concentration of 39 to 42 Baumé degrees as measured with a Baumé hydrometer) is used for the etching solution. This etching solution is supplied onto the copper surface by a shower method or an air-agitation method. In the case where carbon tissue (potash gelatin dichromate) used in ordinary gravure processing is used for the resist film, the depth of the plate concavities is made less than 150 $\mu$m. By this process, plate concavities in which side etching has been suppressed as shown in FIG. 7 are obtained. When the extent of the side etching 21 shown in FIG. 8 is excessively great, the resin which has filled the plate concavities and has set cannot be easily dislodged from the plate concavities, and peeling off becomes difficult. However, by satisfying the above described conditions, peeling off becomes possible.

As a condition for attaining simultaneously a compatible combination of both polishing performance and good separation property of the plate from the mold, the cumulative frequency distribution curve (ogive) of the surface roughness of the roll formplate 1 is also important. More specifically, when the steps of: obtaining statistical data of the heights of the hills (concavities/convexities) of the surface of the roll formplate by means of a measuring and curve-plotting instrument for surface roughness of an electric tactometric type, optical type, or the like; and plotting cumulative frequency distribution function f (R) curves with surface roughness, that is, height of the hills, R, as abscissa and cumulative frequency distribution function of the surface roughness $$f(R) = \int_{x=0}^{R} P(x)dx$$

Figure 11:
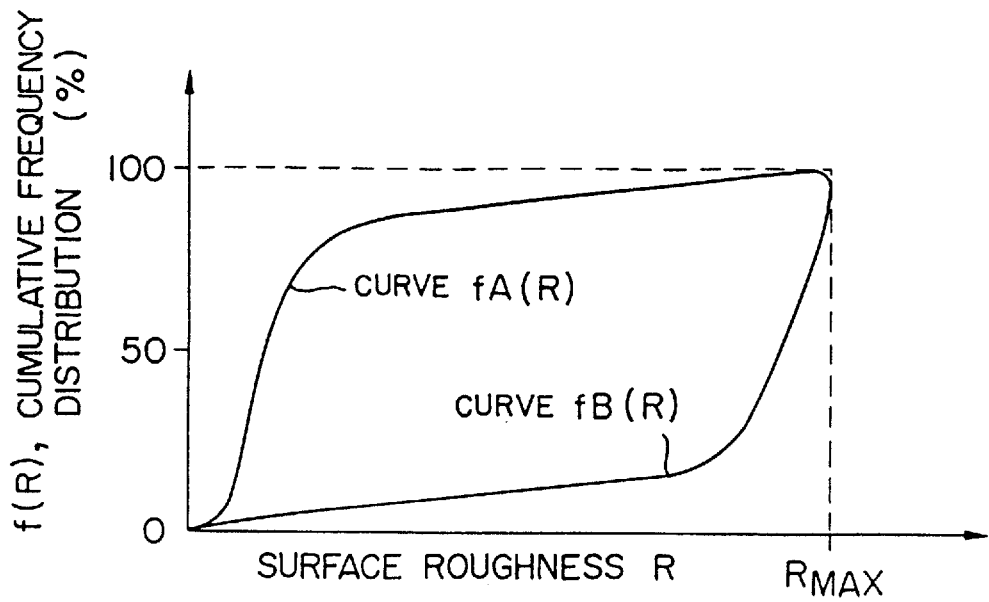
FIG. 11 is a graph indicating a curve of cumulative frequency distribution of surface roughness of a roll formplate.

(where P(R) is the probability density function of the surface roughness R) as ordinate are taken, curves as shown in FIG. 11 are obtained. Then, even if the maximum value $R_{max}$ is the same, the rise of the curve is gentle as in the curve $f_B(R)$ in FIG. 11, and, in the case where it becomes a curve of downward convexity, the mold separation of the formplate is good. According to this invention, as shown in FIG. 11, the design is carried out so as to obtain a curve of this character.

On the other hand, in the case where the rise of the curve is steep as in the curve $f_A(R)$, and it becomes a curve of upward convexity, the mold separation of the formplate becomes poor.

Figure 12:
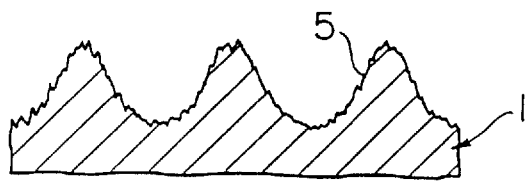
FIGS. 12 through 14 are sectional views respectively showing various shapes of concave parts of roll formplates.
Figure 13:
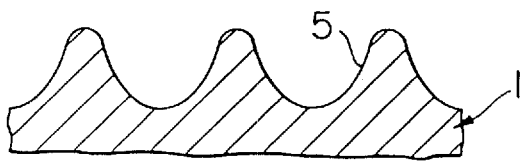

A specific example of the shape of the formplate surface in the case of a function such as is indicated by curve $f_A(R)$ is as shown in FIG. 12. In the case of a function such as is indicated by curve $f_B(R)$, the shape becomes as shown in FIG. 13, for example.

Figure 14:
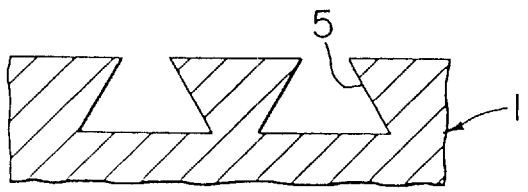

In the case of a shape wherein the sectional area of the plate concavity 5 increases toward the bottom, as in FIG. 14, the polishing layer after curing cannot be separated from the mold. Such a shape is therefore unsuitable for attaining the objects of this invention. An example of such a shape is shown in FIG. 8, wherein side etching has been carried out by the etching method as described hereinbefore. In addition, in the case where a matte-plated surface comprising an aggregate of fine lump-shaped (spherical) particles of a metal such as chromium is provided on the formplate surface, the sectional shape becomes as shown in FIG. 14. Thus, the mold-separation characteristic becomes poor also in this case.

As was mentioned hereinbefore, in the case where, the cumulative frequency distribution curve of the height of the concavities/convexities is as indicated by curve $f_B$ in FIG. 11, that is, the curve has a downward convexity over the entire region from 0% to 100% of the cumulative frequency, good mold separability results. However, even if there is a portion of upward convexity in one part of the cumulative frequency distribution curve, in the case where the point at which the cumulative frequency distribution of the cumulative frequency distribution curve becomes 50% (that is, the point corresponding to the average value) passes on the right-hand side of the middle value of the height, that is, average value≧middle value, amply satisfactory mold separability of the set resin layer from the formplate can be obtained.

Figure 15A:
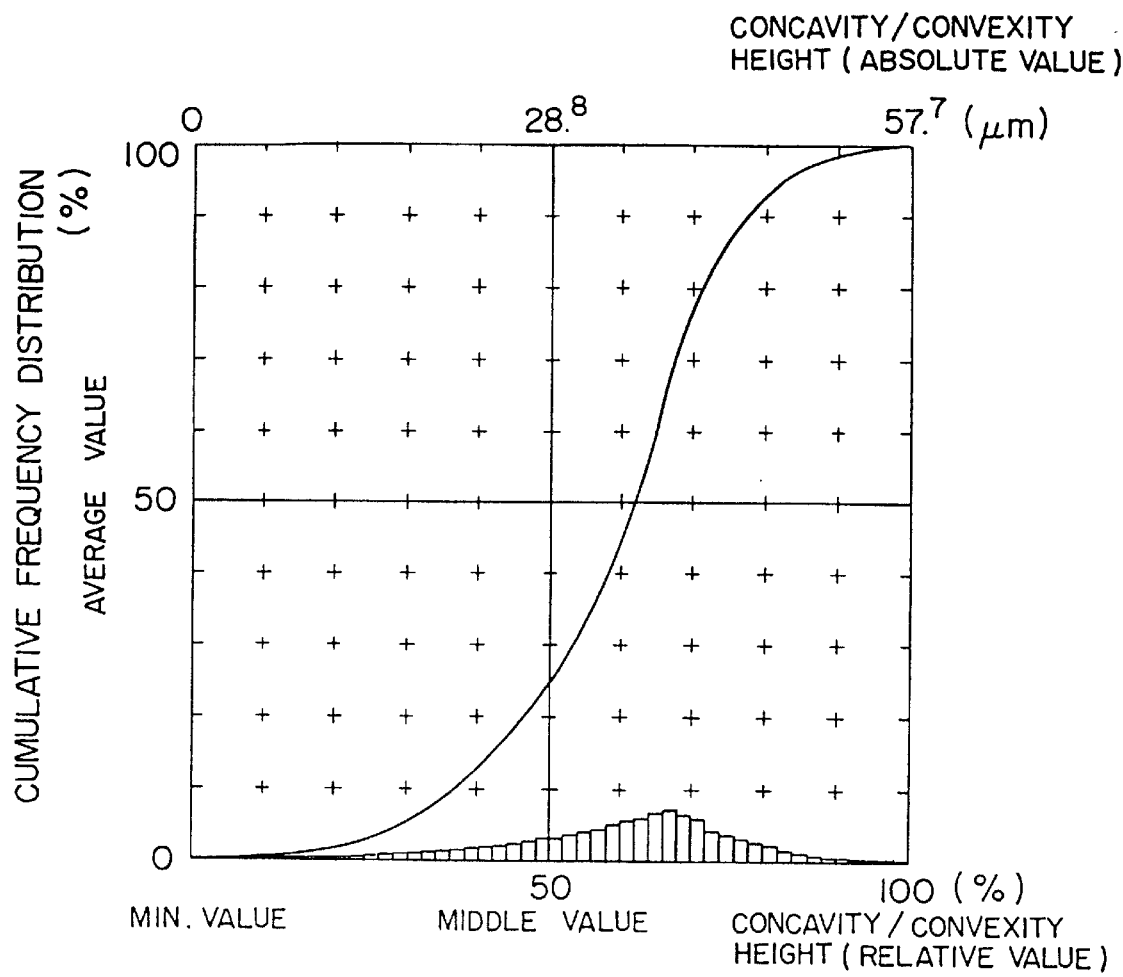
FIGS. 15A, 16A, 17A, 18A, 19A, and 20A are graphs respectively indicating various examples of cumulative frequency distributions of depths of concave parts of roll formplates.
Figure 15B:
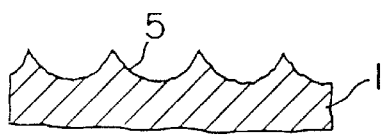
FIGS. 15B, 16B, 17B, 18B, 19B, and 20B are sectional views showing shapes of various different concave parts of roll formplate corresponding respectively to the curves of the graphs of FIGS. 15A, 16A, 17A, 18A, 19A, and 20A.
Figure 16A:
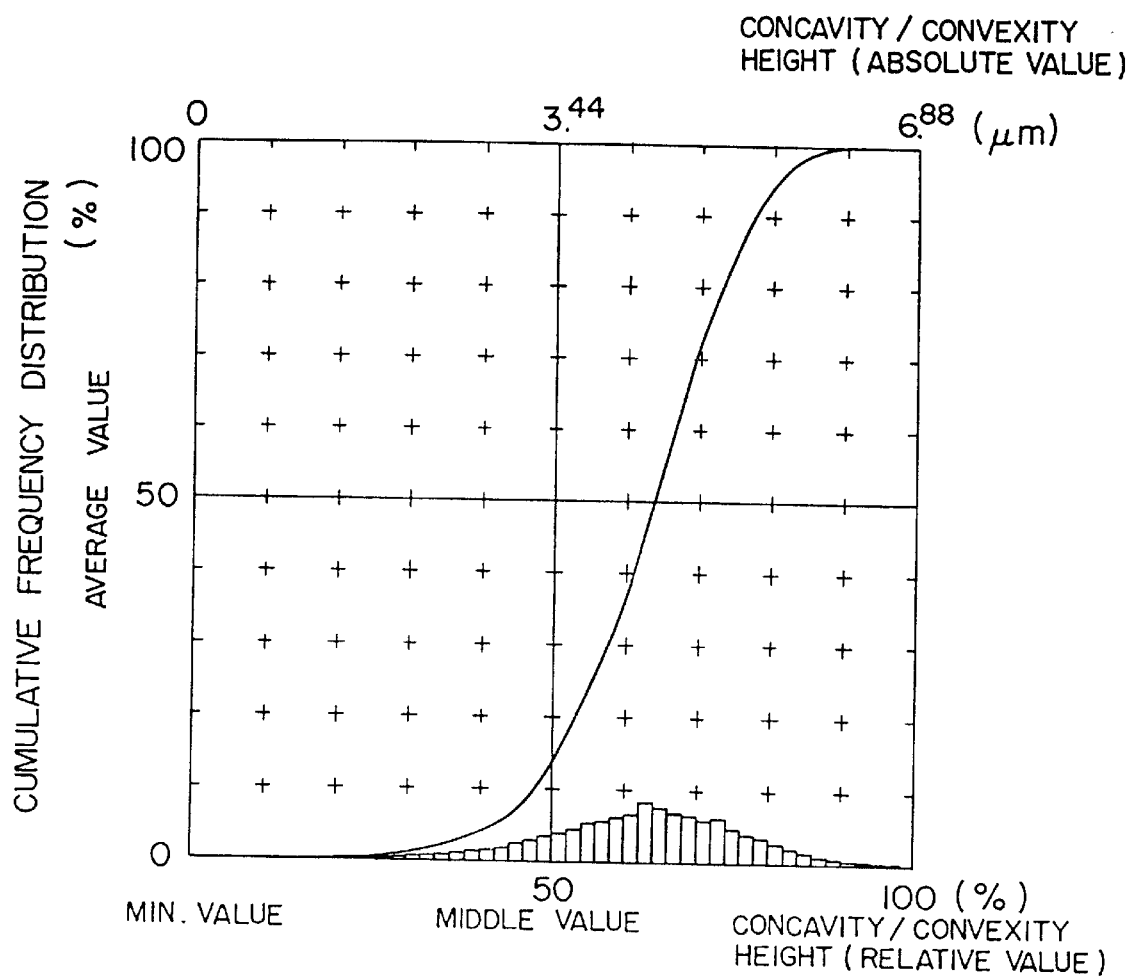
Figure 16B:
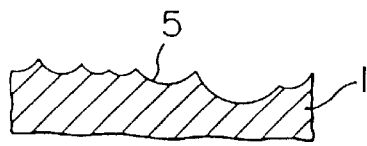

FIGS. 15 and 16 illustrate actual examples of such a case. As indicated in FIGS. 15A and 16A, even if a distribution curve of downward convexity is obtained, the relationship of "average value≧middle value" of the concavities/convexities height in these cases is satisfied, and the shapes of the concavities/convexities are respectively as shown in FIGS. 15B and 16B. Thus the mold separabilities of the set resin layers from the formplate were good. In this connection, the section of the formplate surface of FIG. 15B was obtained by sand-blasting the surface of a smooth copper cylinder with #80 sand, and the section of the formplate surface of FIG. 16B was obtained by sand-blasting the surface of a smooth copper cylinder with #200 sand.

Figure 17A:
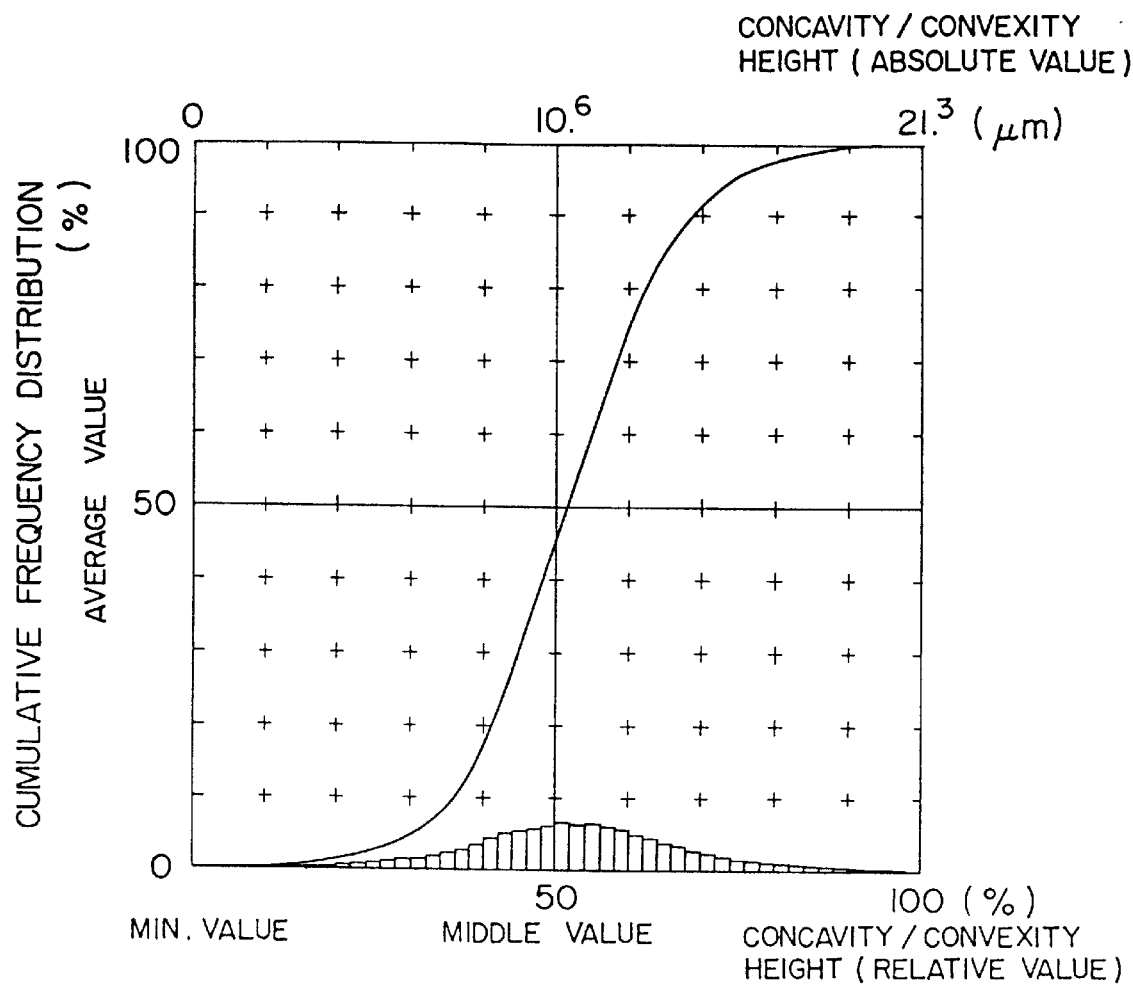
Figure 17B:
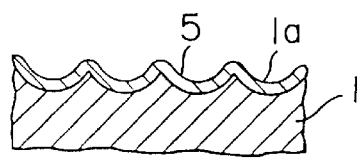

In the case shown in FIG. 17A, the average value is 52% of the maximum value, and moreover the cumulative frequency distribution curve comprises a portion of downward convexity and a portion of upward convexity. In this case, although mold separation was possible, there was some resistance to mold separation. This case indicates borderline or threshold conditions of mold separability. FIG. 17B shows the formplate surface corresponding to FIG. 17A. This sectional shape was obtained by lightly etching the surface of a smooth copper cylinder, sand-blasting this surface with #200 sand, and further plating the surface with lustrous chromium plating as indicated at 1a.

Figure 18A:
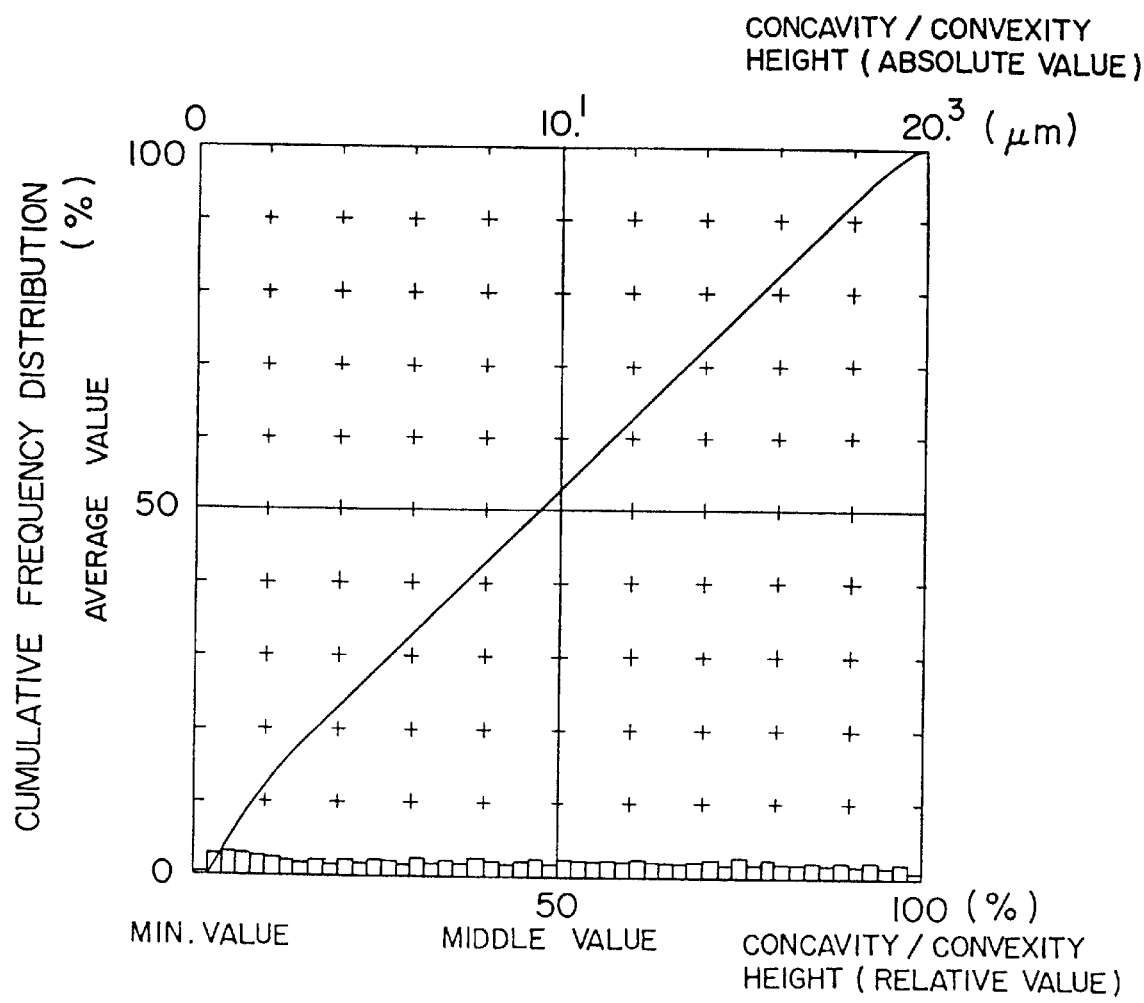
Figure 18B:
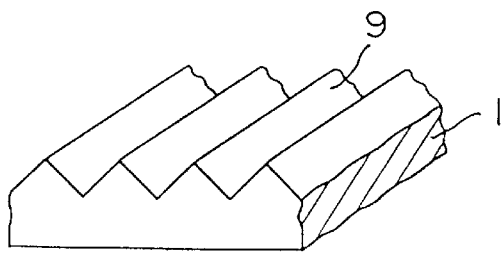

FIG. 18A illustrates a case where the cumulative frequency distribution is linear. In this case, good mold separation was obtained. This is also a case of borderline conditions between $f_A(R)$ and $f_B(R)$ of FIG. 11. FIG. 18B shows the formplate surface corresponding to FIG. 18A. This formplate surface was obtained by forming ridges of a section of a right-angled isosceles triangle on the surface of a smooth copper cylinder by means of a lathe.

Figure 19A:
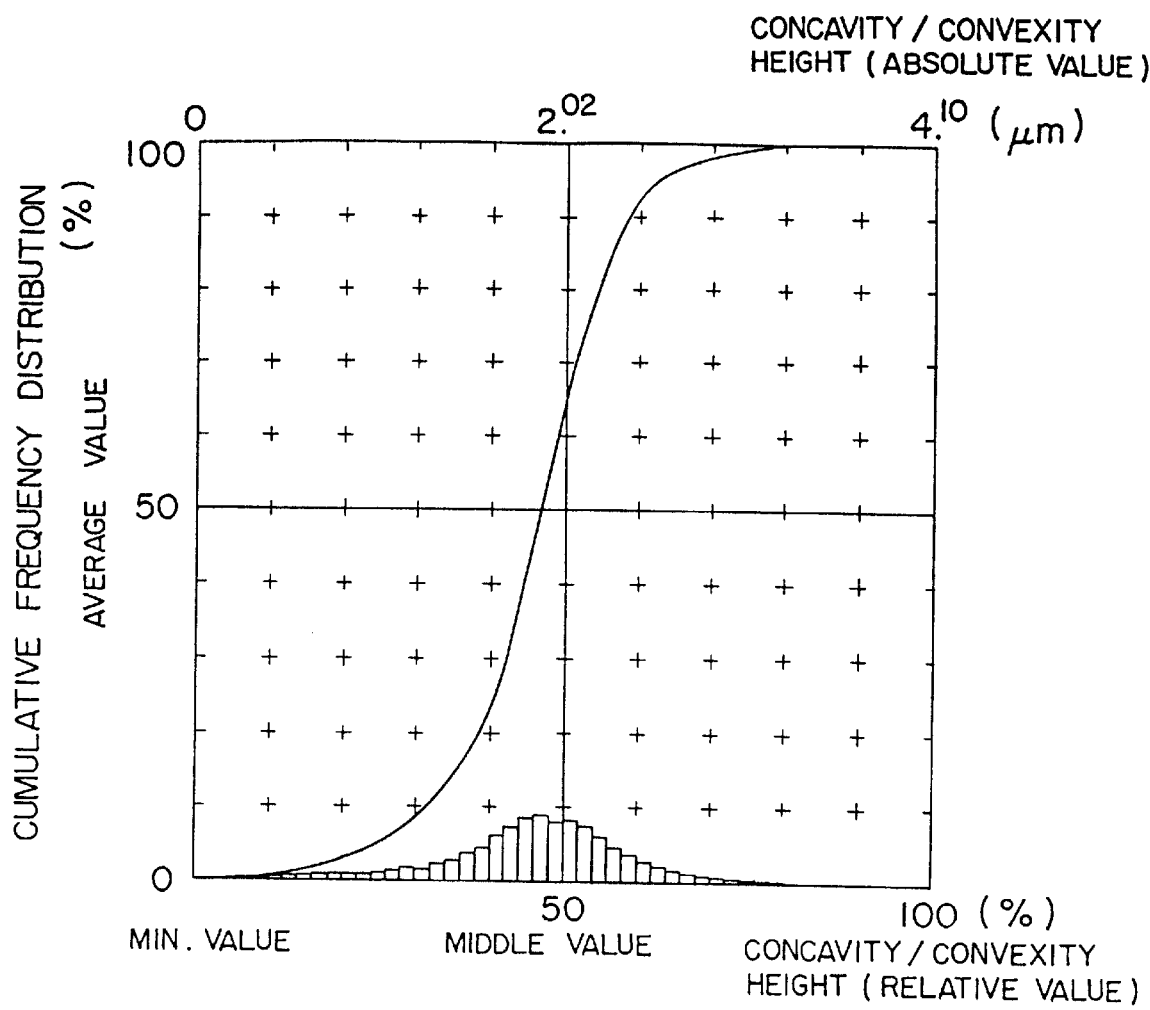
Figure 19B:
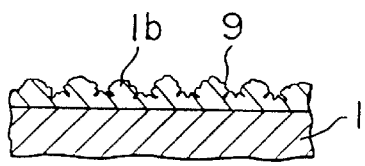

FIG. 19A indicates a case wherein the cumulative frequency distribution curve has a portion of upward convexity and a portion of downward convexity and a relationship of average value<middle value. The mold separability in this case was poor. FIG. 19B shows the formplate surface corresponding to FIG. 19A. In this case, the surface of a smooth copper cylinder was plated with a plating layer 1b of a chromium matte (delustering particulate state).

Figure 20A:
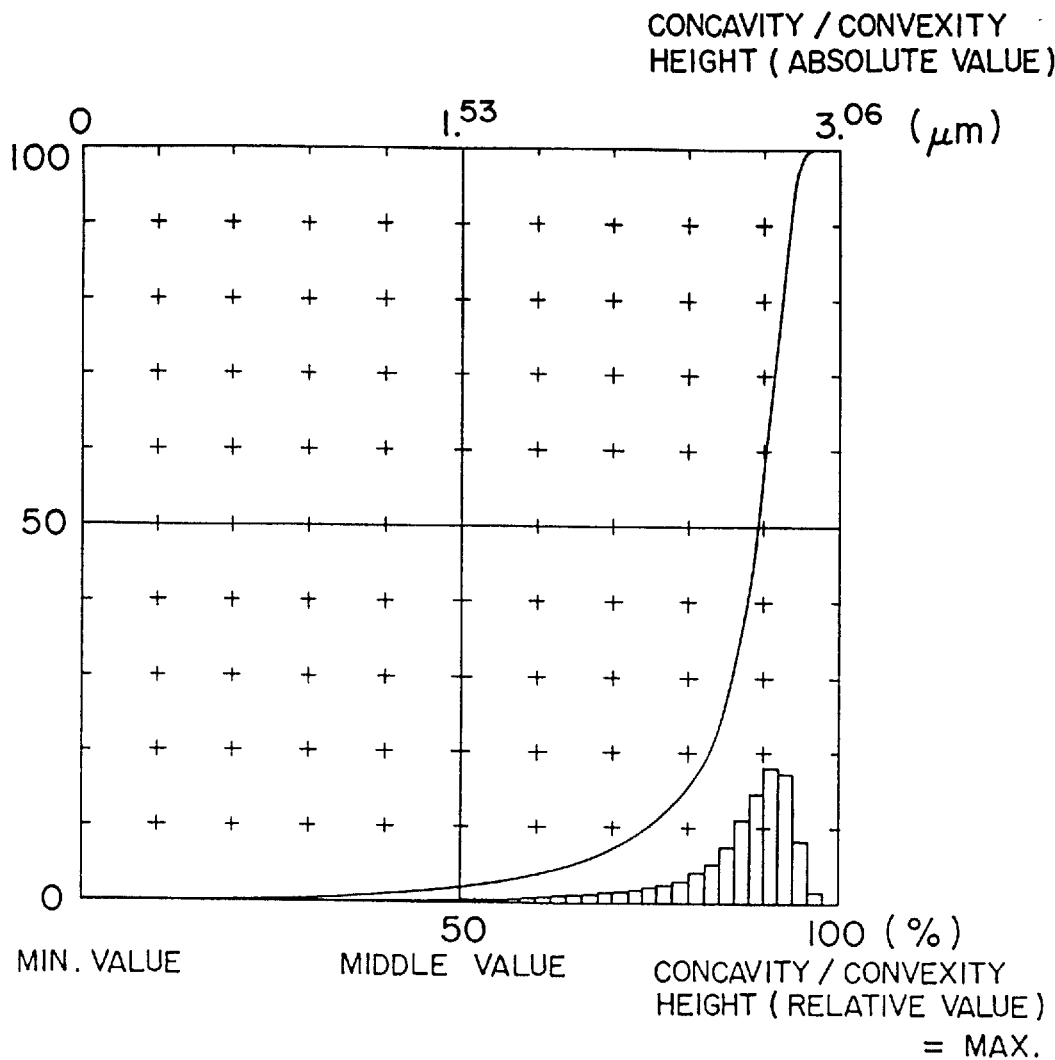
Figure 20B:
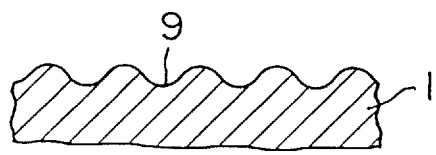

FIG. 20A illustrates a case where the cumulative frequency distribution curve becomes a curve of downward convexity over the entire scope of concavity/convexity height. The peeling characteristic from the roll formplate in this case was good. FIG. 20B shows the sectional shape of the formplate surface corresponding to FIG. 20A. This formplate surface shape was produced by carrying out molding from a polyethylene terephthalate film obtained by kneading thereinto calcium carbonate of particle size of 1 to 10 $\mu$m and fabricating the plate by the electroforming method.

In addition to the recessed parts or depressions of the polishing layer 10 shown in FIG. 3, the examples thereof shown in FIGS. 21 to 25 are possible.

In the polishing layer 10 shown in FIG. 21, the depressions are formed by grooves 9A, which are connected to form a pattern of hexagons, the entire assembly resembling a tortoise-shell. The grooves form hexagonal lands (islands) 23. In the middle of each island, a recess 9B of pin-hole shape is formed.

In the polishing layer 10 shown in FIG. 22, the depressions comprise linear grooves 9c mutually intersecting at substantially right angles. Square lands 24 are thus formed by these grooves 9c.

In the polishing layer 10 shown in FIG. 23, lands 25 of a convex curved surface shape such as a semisphere or semiellipsoid are formed instead of the square lands 24 of the polishing layer of FIG. 22. Depressions 9d are provided around these lands 25.

Figure 24:
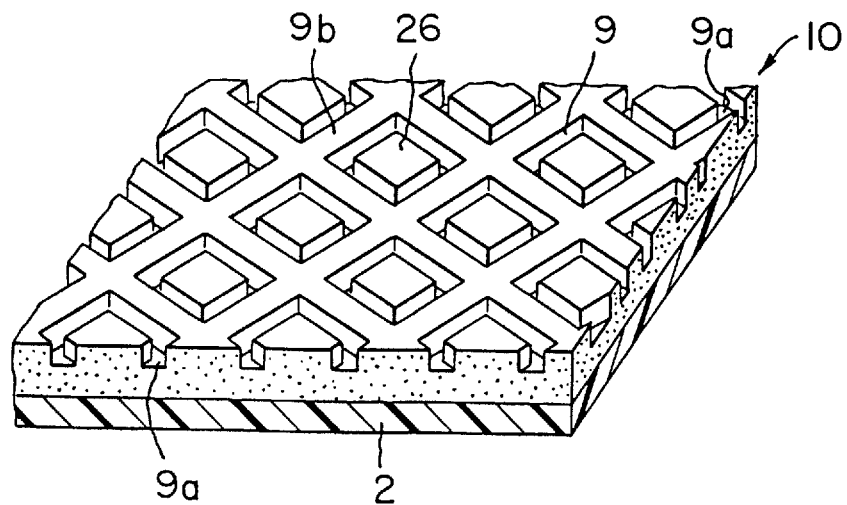

In the abrasive polishing layer 10 shown in FIG. 24, a land 26 is further formed in the middle of each depression 9 in the polishing layer of FIG. 3.

Figure 25:
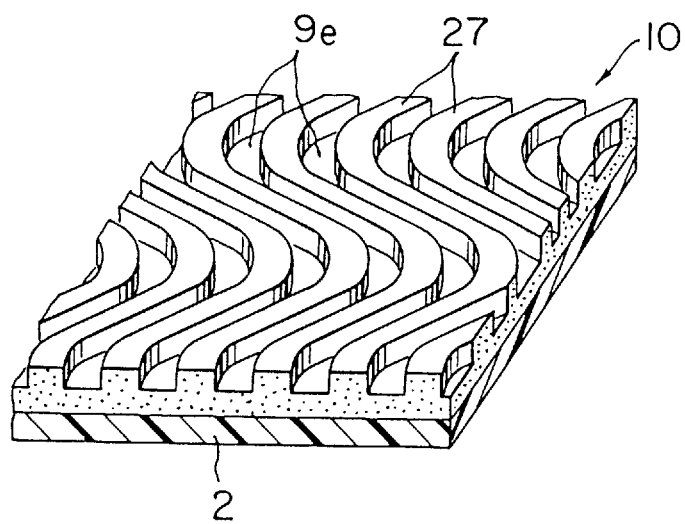

In the polishing layer 10 shown in FIG. 25, parallel lands 27 of curvilinear ribbon form are formed by depressions 9e of curvilinear groove form lying therebetween. The curves of these curvilinear shapes are curves of bounded periodic functions such as a sinusoidal curve, a hyperbolic curve, an elliptic function curve, a Bessel function curve, a cycloidal curve, or an involute curve.

In addition to those described above, the shape of concavities of the polishing layer is suitably selected in accordance with conditions such as the kind of workpiece to be polished, the degree of precision of the polishing, and the object.

In general, in the case of use wherein the polishing quantity is large and a large quantity of the polishing debris is discharged over a long period, a configuration as shown in FIGS. 21 and 22 wherein the volume of the recessed parts for accommodating the polishing debris is relatively large, and, moreover, the groove-shaped recesses extend to the peripheral edge of the polishing layer is suitable.

In certain applications, such as polishing of magnetic recording mediums and magnetic heads, the forming of smooth surfaces with high finishing precision is required. In such a case, the working surface of the polishing layer 10 may take a configuration wherein the recesses 9 are mutually isolated as in the examples shown in FIGS. 3 and 24. Furthermore, in order to attain a high uniformity of finish, it is preferable that the angles formed by the edges of the recesses and the lands therebetween relative to the polishing direction be numerous and that, moreover, the symmetry of the configuration thereof be good. For example, the configuration of the example shown in FIG. 21 is better than that shown in FIG. 24 for this purpose.

The dimensions of the various configurations of the polishing layers shown in FIGS. 21 through 25 are also selected suitably in accordance with the application, the finishing precision, and the material of the article to be polished. In general, however, in the case where finishing precision is required as in the polishing of articles such as magnetic recording mediums, the dimension of the recesses (the width in the case of groove-shaped recesses; the length of one side of each recess in the case of isolated polygonal recesses; and the diameter of each recess in the case of isolated circular recesses), is ordinarily approximated 0.1 to 200 $\mu$m and the depth of each recess is approximately 1 to 100 $\mu$m, as stated hereinbefore.

The forward relief angle $\alpha$ and the rearward relief angle $\beta$ between the front and rear parts of the land, i.e., the convexity, of the polishing layer 10 and the workpiece 30 undergoing polishing, as shown in FIG. 26, are also selected at suitable values in accordance with factors such as the application, the material of the workpiece 30, and the polishing speed.

The relief angles α and β contribute to the performances of discharging and intercepting the polishing debris. That is, as indicated in FIG. 27, the polishing debris 31 is discharged through the range of the relief angles α and β and is intercepted and accumulated in recesses of the polishing layer 10.

Furthermore, the relief angles α and β, together with the contact area ratio R of the polishing layer 10 relative to the workpiece 30, contribute to the polishing efficiency. The contact area ratio R can be expressed by the following equation.

$$R = \frac{\Sigma Sc}{\Sigma Sc + \Sigma Sg} \approx \frac{\Sigma Sp}{\Sigma Sr + \Sigma Sp},$$

wherein: Sc is the area of contact between the polishing layer 10 and the workpiece 30; Sg is the projected area of the portion of the polishing layer 10 that is not in contact with the surface of the workpiece (i.e., the portion with a space gap therebetween) which area is projected onto the surface of the film substrate 2; Sp is the area of the flat portion of the top parts of the lands of the polishing layer 10; and Sr is the area of the other portions (corresponding to the concave portions) projected onto the surface of the film substrate 2.

The approximation of the furthest right side of the above equation is effective in the case where the tops of the lands are flat as in FIGS. 26 and 27. Each summation Σ is taken over an amply broad area of the polishing layer 10. If the contact area ratio R becomes too small, the portion of the polishing layer 10 which is not used will increase. On the other hand, if the ratio R becomes too large, the capacity of the polishing layer 10 to discharge/intercept the polishing debris 31 will drop.

As described hereinbefore with respect to the example shown in FIG. 1, the plate concavities 5 of the roll copper plate 1 can be supplied and filled with an ionizing radiation setting resin by a roll-coating method with the use of coating rolls 7. This supplying and filling process can be carried out alternatively also by other methods. For example, this process can be carried out by supplying the resin from a die such as a T die as described hereinafter. Another possible method comprises coating and forming the resin by a method such as roll coating beforehand on the film substrate 2 before the substrate 2 contacts the roll formplate 1.

Figure 28:
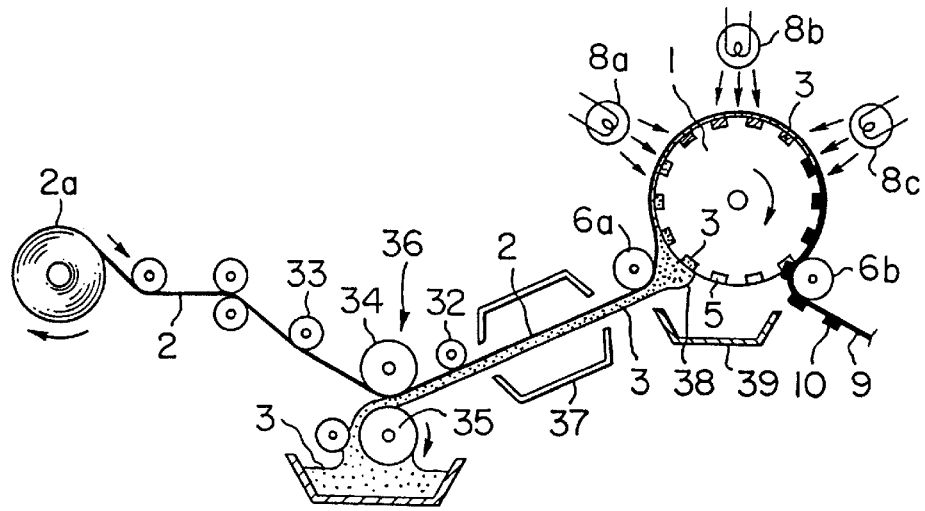
FIG. 28 is a view for describing another example of the method of producing an abrasive tape according to this invention.

The resin can be applied as a coating on the surface of the film substrate 2 in the following manner. As shown in FIG. 28, the film substrate 2 stock is supplied from a supply roll 2a to a roll-coating section 36 comprising guide rolls 32 and 33, pressing roll 34, and a coating roll 35 as essential parts. In this roll-coating section 36, the ionizing radiation curable resin 3 in liquid form is applied as a coating on the substrate 2 thus supplied. Next, in the case where the resin 3 contains a diluting solvent, the substrate 2 is passed through a drying device 37, where the dilute solvent is evaporated off by a method such blowing warm air. Thereafter, by means of a pressing roll 6a, the coated surface of the film substrate 2 is pressed into contact with the surface of the roll formplate 1. A portion of the coated resin layer 3 is thereby forced to fill the interior of the plate concavities 5. Reference numerals 38 and 39 designate a liquid accumulation and an ink pan, respectively. In addition to roll coating, this coating process can be accomplished by suitably applying any of various methods such as gravure roll coating and flow coating.

Figure 29:
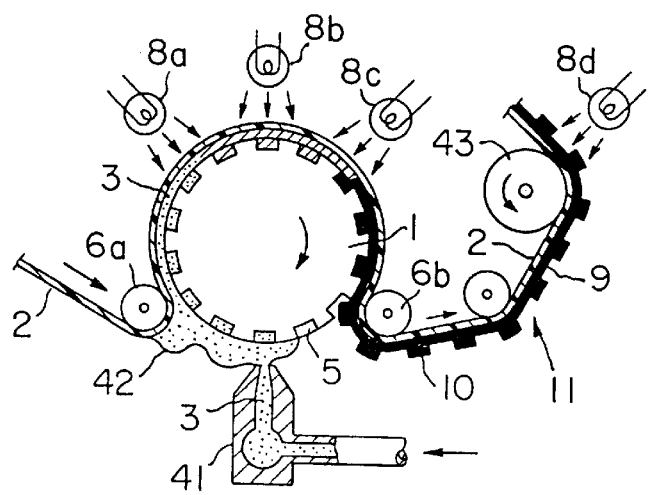
FIG. 29 is an explanatory view showing still another example of the abrasive tape production method according to the invention.
Figure 30:
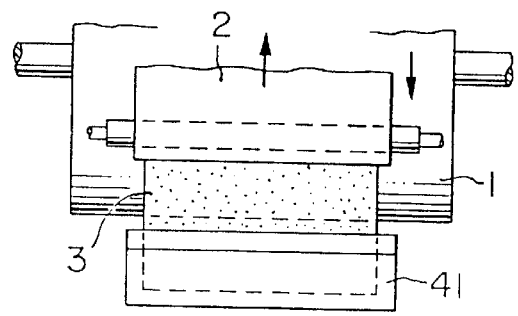
FIG. 30 is a partial view from the left of FIG. 29.

The resin liquid can be applied onto the surface of the roll formplate also by another method as follows. As shown in FIG. 29, as the roll formplate 1 is rotated, liquid resin 3 is ejected through a T-dye type nozzle 41 and applied on the surface of the formplate 1. Thus the resin 3 is caused to fill the interiors of the plate concavities 5. Separately, but simultaneously, uncoated film substrate 2 is supplied in the arrow direction and is pressed into forceful contact with the coated surface of the roll formplate 1 by a pressing roll 6a. FIG. 30 is a view from the left side of FIG. 29. In this connection, it is possible to use also another method of coating the surface of the formplate 1. One example of an alternative method is dipping of the roll formplate 1 directly in the liquid resin in an ink pan.

In any of the above cases, it is important to prevent the mixing of air bubbles into the resin between the film substrate 2 and the surface of the roll formplate 1. A specific preventive measure for this purpose is as follows. As shown in FIGS. 29 and 30, surplus resin liquid 3 is supplied beforehand through the nozzle 41. Then, surplus resin liquid is squeezed out by rubbing action due to the compression by the pressing roll 6a, thereby to form a liquid accumulation 42. As a result, air is also squeezed out by the rubbing action.

When the above two methods are compared, the method of coating onto the side of the film substrate 2 as indicated in FIG. 28 is preferable in the case where the depth of the plate concavities 5 of the roll formplate 1 is relatively shallow, and where the fluidity of the resin liquid is also good, or where a dilute solvent is used.

Still another case where the method of coating onto the film substrate side of FIG. 28 is suitable is the case where, as a consequence of the addition of the abrasive polishing material, the fluidity of the ionizing radiation curable resin 3 becomes poor, and an increase in its viscosity and thixotropy, dilatancy, and the like occur. Consequently, coating and supplying the resin cannot be carried out without dilution of the solvent.

In this case, if coating were to be carried out directly on the surface of the roll formplate as shown in FIG. 29, drying of the solvent would become difficult. Accordingly, as indicated in FIG. 28, a resin solution which has been amply diluted with the solvent is first applied as a coating on the film substrate to form a coating film of the desired surface smoothness. Thereafter, by means of a drying device, the diluting solvent is evaporated off. The coating film is then caused to contact the roll formplate.

The reason for this procedure is that, if the solvent remaining as it is in residual state in the coating film were to be clamped and entrapped between the film substrate and the roll formplate, the residual solvent, being unable to escape, would remain as bubbles in the coating film. As a consequence, there would arise the possibility of the shapes of the surface concavities and convexities, the strength of the coating film, and the polishing performance being impaired. As a specific example, in the case of quartz (silica) sand, solvent dilution becomes necessary when the quantity thereof added is 50 percent by weight or more.

On the other hand, when the concavities of the roll formplate are relatively deep, and when the fluidity of the resin liquid is amply good, the method of direct coating onto the formplate surface as shown in FIG. 29 is suitable.

According to the present invention, a roll formplate of a rigid material such as a metal or glass is used. Furthermore, the film substrate is pressed by a pressing roll over the resin liquid, and moreover a tension is applied to the film substrate.

For this reason, as shown in FIG. 31, the particles P of the polishing material in the vicinity of the surface of the polishing layer 10 are blocked and prevented from protruding outward by the plate surface of the roll formplate 1. Furthermore, the resin liquid (binder), aided by the pressing pressure, amply flows into and fills also the interface between the polishing material particles or grains P and the plate surface. As a result, the surface of the polishing layer 10 after being thus molded becomes a smooth surface as indicated in FIG. 32.

Of course, it is also possible to obtain a polishing layer 10 with a surface having concavities and convexities of the set resin corresponding to the polishing particles or grains P or a polishing layer 10 with a portion where polishing particles or grains P have been exposed directly at the surface as shown in FIG. 33. Such a polishing layer 10 can be obtained by measures such as reducing the pressing pressure or the fluidity of the resin liquid or by selecting somewhat high values of the curing shrinkage rate of the liquid of the resin 3 of ionizing radiation curing type. In comparison with the case illustrated in FIG. 32, that shown in FIG. 33 has a greater polishing capacity.

Even when the liquid of the same ionizing radiation curable resin is used, it is possible, depending on the method of curing, to cause the uneven shapes of the polishing particles P to emerge out of the surface of the set resin layer, as shown in FIG. 33, or furthermore to cause portions of the polishing particles P themselves to be directly exposed at the surface.

Figure 38:
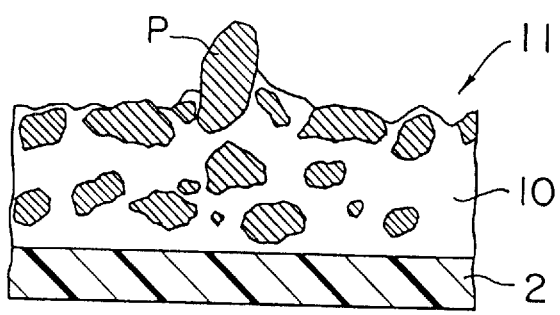
FIG. 38 is an enlarged sectional view indicating an undesirable state occurring in a polishing layer.

More specifically, in comparison with the method of curing with ultraviolet rays, setting with an electron beam increases the crosslinking density of the resin and increases the curing shrinkage rate. Therefore, even with the same resin liquid, when curing is carried out with an electron beam, or when, after partial curing is first caused to proceed with ultraviolet rays, the remainder is cured with an electron beam, a state resembling more closely that shown in FIG. 33 can be obtained. In either of the cases illustrated in FIGS. 32 and 33, it is possible to prevent large protrusions of polishing particles outward from the surface of the resin layer 10 as shown in FIG. 38 which has occurred with prior art methods.

One mode of practice of the preferred resin curing method according to this invention is illustrated in FIGS. 28, 29, 34, 35, and 36. As indicated, by a multistage curing process, the polishing particles or grains in the polishing layer are caused to be more densely distributed in vicinity of the surface of the polishing layer. More specifically, as shown in FIGS. 28 and 29, a plural number of ionizing radiation devices 8a, 8b, and 8c are installed at positions to confront and irradiate the surface of the roll formplate 1, being spaced at suitable intervals in the circumferential direction of the formplate 1.

In the setting process of the ionizing radiation curable resin liquid 3, the relationship between the total irradiation energy E required for completion of curing of N radiation devices 8a, 8b, 8c, . . . , 8N and the irradiation energies $E_1$, $E_2$, $E_3$, . . . , $E_N$ respectively thereof is as follows.

$$E = E_1 + E_2 + E_3 + \ldots + E_N$$

The irradiation of the ionizing radiation rays is carried out successively in this order by dividing (E).

Ordinarily, the relationships between the respective energies of the radiation devices are approximately as follows.

$$E_1 \approx E_2 \approx E_3 \ldots \approx E_N = E/N$$

However, the relative distribution of these energies $E_1$, $E_2$, $E_3$, . . . , $E_N$ is suitably adjusted in accordance with factors such as the desired distribution of the polishing particles in the thickness direction of the polishing layer, the kind of resin to be set, and type of irradiation.

The stages of an example of the multistage setting process of this character are shown in FIGS. 34 through 37.

Figure 34:
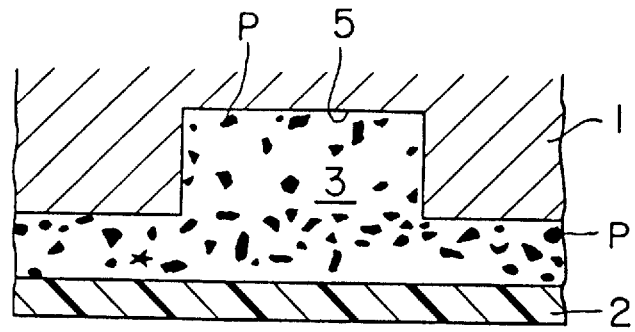
FIGS. 34 through 37 are enlarged sectional views indicating successively the steps of another process of forming the polishing layer of an abrasive tape.
Figure 35:
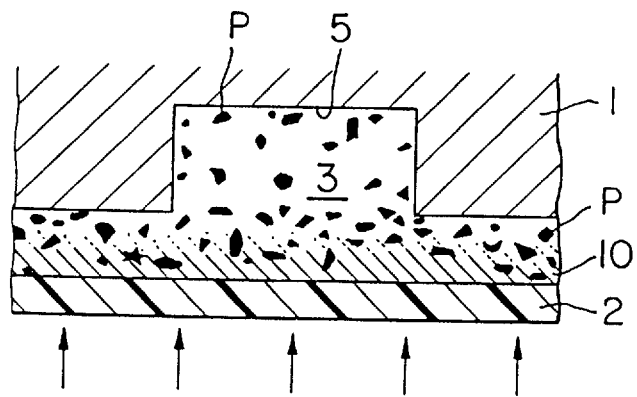

First, as indicated in FIG. 34, a film substrate 2 is pressed against the surface of the roll formplate 1 over the yet to be cured resin liquid 3 interposed therebetween. The resin liquid 3 is thereby covered and caused to adhere intimately. Next, at the position confronted by the first ionizing radiation device 8a, ionizing radiation rays are projected onto the coated film 3 (polishing layer 10). Thereupon, as indicated in FIG. 35, the resin 3 closer to the side of the film substrate 2 sets. As a consequence, the distance between the molecules in the resin liquid 3 in this region is narrowed by the cross-linking reaction, and the resin 3 shrinks in volume. As a result, the polishing material particles P, which had been dispersed, are squeezed out from the spaces between the molecules and migrate from the side of the film substrate 2 toward the yet not cured resin on the formplate side.

Figure 36:
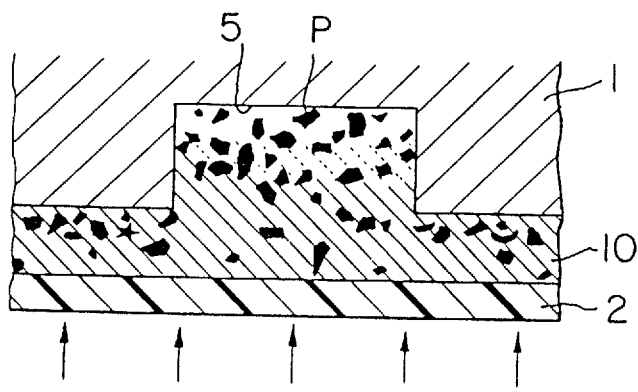
Figure 37:
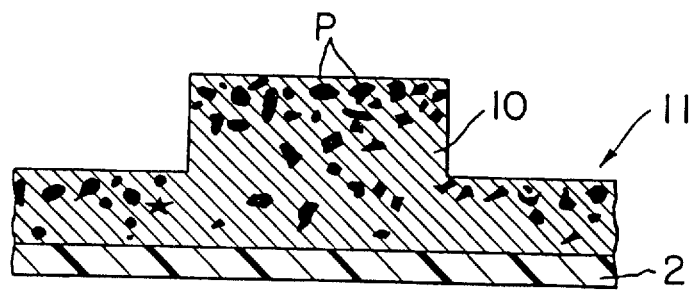

Then, at the position confronted by the second radiation device 8b, radiation of the coated film 3 is continued. The resin nearer to film substrate 2 thereby undergoes cross-linking and shrinks in volume as indicated in FIG. 36. Consequently, the polishing material particles P migrate further toward the direction of the formplate 1. Then, when the coated film 3 is irradiated by the third radiation device 8c, the polishing particles P are moved further toward the formplate (not shown). Thereafter, as the resin layer 3 thus cured (polishing layer 10) is separated from the surface of the formplate 1, an abrasive tape 11 in which the polishing particles P are distributed with even higher density in the vicinity of the surface, as indicated in FIG. 37, is obtained.

Thus, by this method of curing by multistage ionizing radiation, particles added into a coated film are caused to rise to the surface thereby to obtain a coated film in which the particles are distributed with high density in the vicinity of the coated film surface. This method per se has been previously disclosed in Japanese Patent Publication No. 58-15183 and Patent Application Laid-Open No. 2-261572. By the methods as thus disclosed previously, the coated film is cured in free air. Therefore, although the effect of causing the added particles to rise is good, the particles could not be prevented from protruding out through the surface of the coated film.

In contrast, by the method of this invention, the multistage setting of the resin is carried out with the surface of the coated film in a state of being fixed to the surface of the formplate. For this reason, an excellent polishing layer 10 as shown in FIG. 37 is obtained. Thus, protrusion of particles or grains outward through the surface due to the high density of the polishing particles in the vicinity of the surface as shown in FIG. 38 is prevented.

In some cases it is necessary to increase the cross-linking density at the surface of the polishing layer and to increase the surface hardness and resistance against heat and chemicals. This can be accomplished in such cases by further irradiating with ionizing radiation rays the abrasive tape 11 from the polishing layer side after the tape 11 has been separated from the roll formplate 1. More specifically, for example as indicated in FIG. 29, a back-up roller 43 and an ionizing radiation irradiation device 8d are provided on the downstream side of the feed-out roll 6b. At this position, the abrasive tape 11 is in intimate contact with the back-up roller 43 and is irradiated in wrapped state by the irradiation device 8d.

A particularly effective method of increasing the cross-linking density of the surface comprises, first, setting with ultraviolet rays the polishing layer at the roll formplate surface and then, after separation from the formplate, irradiating the outer surface side of the polishing layer with an electron beam. Although the mechanism of the action of this process is not yet clear, by carrying out irradiation with an electron beam after curing with ultraviolet radiation, the hardness of the surface can be increased without overly lowering the calcinability of the entire resin layer.

However, if the irradiation is carried out excessively, the coated film will become fragile. As a consequence, when the abrasive tape is caused to assume a curve or is used in polishing, problems such as the development of cracks in the polishing layer and separation of the polishing layer occur. For this reason, appropriate quantity of irradiation and cross-linking density must be set.

Control of the temperatures of the roll formplate 1 and the back-up roller 43 is also important. In general, infrared rays are also radiated from sources such as mercury lamps and carbon-arc lamps. Furthermore, in all cases where the ionizing radiation is by ultraviolet rays, an electron beam, or the like, a part of the absorbed radiation energy changes into heat. Consequently, if this heating becomes excessive, defects such as deformation and heat deterioration will occur in the cured resin layer or film substrate. A measure for preventing this, in the case of a mercury lamp or a carbon-arc lamp, is to insert a filter which transmits ultraviolet rays but shuts off infrared rays. In the case where even this is insufficient, however, an effective measure is to cool the roll formplate itself. Since the resin coated film and the film substrate are both adhering intimately to the roll formplate, the heat generated in the coated film or the film substrate is rapidly absorbed by the roll formplate and cooled.

A specific example of practicing this method comprises using a roll formplate or/and back-up roller of hollow construction and passing cooling water through the interior thereof. In some cases, good results are obtained by heating the roll formplate or/and back-up roller to an appropriate temperature. This is a useful method for solving the problem of internal stress and/or residual strain remaining in the coated film (polishing layer) which has been cross-linked and cured by ionizing radiation.

In this case, a suitable surface temperature of the roll formplate and the back-up roller is ordinarily of the order of 30° to 80° C. However, since heat generation accompanies ionizing irradiation, it is necessary to take precautionary measures for preventing the temperature of the roll from rising above a limiting temperature with the passage of time. A specific measure is to use a hollow roll formplate and back-up roller and to pass therethrough warm water at a specific temperature. By this measure, absorption of heat by the heat capacity of the water itself and discharging of heating by the flow of the water are accomplished.

Figure 39:
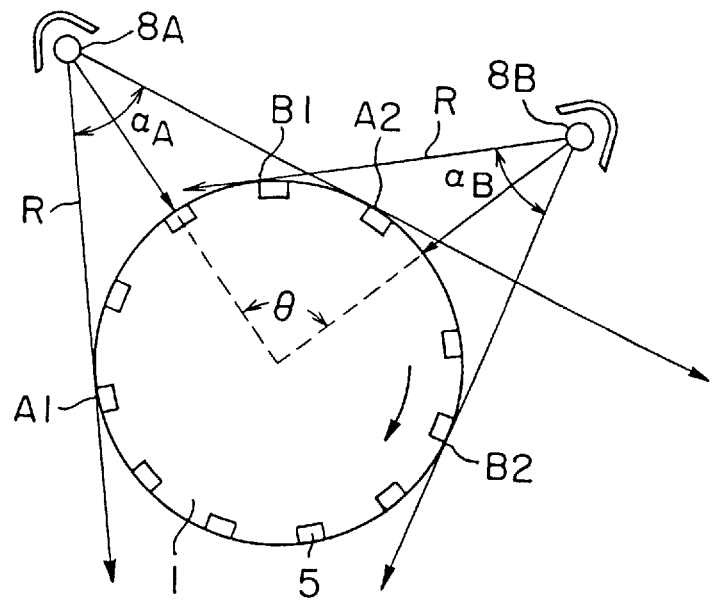
FIG. 39 is a diagram indicating an example of a desirable positional layout of apparatus for irradiating a roll formplate with radiation rays.

In the case where a plurality of ionizing radiation irradiating devices as described hereinbefore are to be provided, an arrangement as shown in FIG. 39 is suitable. In this arrangement, two irradiating devices 8A and 8B are provided around the roll formplate 1 at spaced apart positions. These spaced apart positions are such that the angle θ between the lines respectively joining the two irradiating devices 8A and 8B to the center O of the formplate 1 is 90 degrees. The points (lines) at which lines that radiate from the irradiating device 8A and are tangent to the outer surface of the formplate 1 respectively at opposite sides thereof are designated A1 and A2. The points (lines) at which lines that radiate from the irradiating device 8B and are tangent to the outer surface of the formplate 1 respectively at opposite sides thereof are designated B1 and B2. Then, in the case where a uniform irradiation intensity (W/m$^2$) within the irradiated region A1-B1-A2-B2 on the circumferential surface of the roll formplate 1 is desired, portions of the irradiation regions of the irradiating devices 8A and 8B are caused to overlap (as at B1-A2).

In the case where it is more desirable to provide a non-irradiated region between the region irradiated by the irradiating device 8A and the region irradiated by the irradiating device 8B, the irradiation intensity of the arc B1-A2 is caused to be zero (0). This is a case where, for example, the internal stress of the polishing layer due to irradiation by the irradiating device 8A is once reduced, or the polishing layer whose temperature has been raised is once cooled, and thereafter the remaining irradiation is carried out.

The quantity of ionizing radiation rays that have been irradiated can be used effectively without waste by either of the following methods. In one method, the radiation rays emerging with maximum diverging angle from the irradiating devices 8A and 8B are caused to become tangents of the outer surface of the roll formplate 1 as shown in FIG. 39. In the other method, the irradiating devices are positioned even closer to the roll formplate 1. However, if they are brought excessively near the roll formplate, the irradiation quantity will become excessively great. This will give rise to problems such as: deformation or cracking in the set coated film due to rapid curing of the resin; and heat generation due to radiant heat unavoidably admixed with the radiation from the irradiating devices or due to conversion into thermal energy of the radiation rays in the coated film, this heat generation giving rise to a high temperature rise in the coated film and thermal deterioration thereof. Therefore, the irradiating devices are kept at an appropriate distance. In this connection, for the purpose of coating the roll formplate, it is necessary to leave at least 90/360 of whole circumference thereof as a non-irradiation region.

Figure 40:
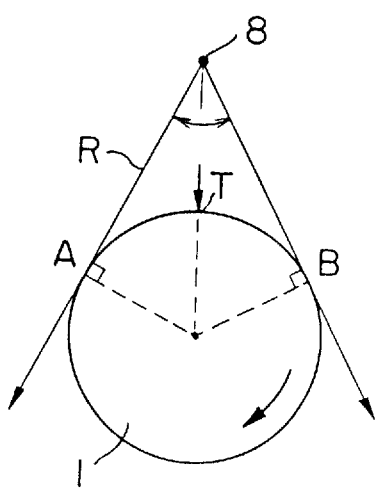
FIGS. 40 and 41 are diagrams respectively indicating different examples of positional layouts of apparatus for irradiation with radiation rays.

Advantages obtainable from the arrangement of FIG. 39 are as follows. In the prior art as disclosed in, for example, Japanese Patent Laid-Open Publn. Nos. 2-131175 and 4-200766, only one irradiating device was provided. In such a case, as indicated in FIG. 40, the region ATB used for irradiation out of one circumference of the roll formplate 1 is a limited range. The irradiated region even at its maximum limit is up to one half of one circumference (as in the case shown in FIG. 41). In this case, the irradiating device is at an infinitely remote point, and furthermore a parallel radiation flux of amply large area is used.

When, under these circumstances, an attempt is made to obtain ample setting of the resin liquid, the total energy from the radiation source is concentrated in a small area. As a result, the unit irradiation (W/m$^2$) becomes large, and, moreover, the total irradiation density (J/m$^2$) is projected. As a consequence, the coated film rapidly sets, and stresses are not amply relieved. For this reason, development of strain and cracks in the coated film tend to occur. Furthermore, because of radiant heat arriving in admixed state from the irradiation source and/or thermal energy arising from conversion into heat of a portion from the ionizing radiation rays within the coated film, the temperature of the coated film rises to a high value, whereby heat deterioration occurs therein in some cases, and it is difficult to carry out satisfactory setting of the coating film and forming of the concavities and convexities.

It may seem possible to solve the above described problems by increasing the rotational speed of the roll formplate (travelling speed of the film substrate). However, if the rotational speed is increased excessively, the action of the resin liquid in filling the interiors of the concavities of the roll formplate and its displacing the air will not take place satisfactorily. Furthermore, since the time period during which any one part of the coated film is irradiated becomes shorter, the irradiation ends before cross-linking of the resin liquid or polymerization reaction can occur completely, whereby defective setting of the coated film occurs in some cases.

Figure 41:
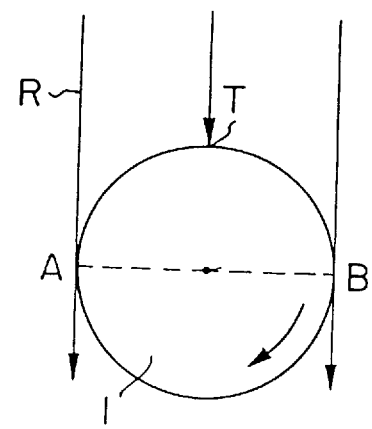

On the other hand, by setting the angle θ between the centerlines of the radiation beams from the two irradiating devices 8A and 8B in the arrangement shown in FIG. 39 at 90 degrees, it becomes possible to obtain an irradiated region out of one circumference of the roll formplate which is twice as large as that in the case of one irradiating device as shown in FIGS. 40 and 41. A maximum of 270/360 of the entire circumference (a region of a central angle of 270 degrees) can be obtained as the irradiated area. (However, the ratio 270/360 is that for the case where the irradiating device is infinitely remote (at a far distance of an order which can be thus stated) or for the case where a surface irradiating device radiating a flux of parallel rays is used; ordinarily it is less.) For example, in the case of FIG. 39, 210/360 of the entire circumference becomes the irradiated region.

Of course, it is also possible to position three or more irradiating devices around the roll formplate and to carry out irradiation by setting the angle between the lines joining adjacent two irradiating devices with the center of the roll formplate at less than 90 degrees. In such a case, it is also possible to obtain an irradiated region of over 270/360 of the entire circumference.

However, ordinarily for the process of applying as coating the ionizing radiation curing type resin liquid on the roll formplate and for displacement of air by the resin liquid and filling of the concave parts (furthermore for drying of the solvent if the solvent dilution has been carried out), a region of a minimum of the order of 90/360 of the entire circumference is necessary. Furthermore, in view of the curing speed and quantity of irradiation necessary for curing of ordinary resins of ionizing radiation setting type in practical use at present, the irradiation output of the radiation source (principally ultraviolet rays or electron beam) and the like, two irradiation devices are ample. (The irradiation quantity can be adjusted to some extent also by the rotational speed of the roll formplate).

Accordingly, the optimum process is to use two irradiation sources and a center angle formed thereby of 90 degrees. By this process, a large irradiation region area of a maximum of 270/360 out of the entire circumferential surface of the roll formplate required in practice can be obtained. Moreover, by irradiating the irradiation quantity density necessary for the curing of resin liquid coated film over an amply long time, deformation, cracking, or thermal deterioration of the coated film due to rapid curing can be prevented. In this connection, it is possible, by adjusting the radiation angle of the irradiating device and/or the distance between the irradiating device and the roll formplate, to accomplish a substantially uniform irradiation over the entire region to be irradiated. Alternatively, it is also possible to divide the irradiation into two steps and to leave a region of rest without irradiation. These possibilities can be suitably selected. Then, as described hereinbefore, in the region of 90/360 of the entire circumference (region of 90° center angle) as a minimum, there exists a region not reached by direct irradiation of the ionizing radiation rays. For this reason, there is little possibility of the supplied resin being partially or totally set by stray ionizing radiation rays prior to the forming of the resin by the roll formplate.

The polishing material or agent used in the present invention is not particularly limited provided that it is one that is used for the purpose of carrying out precision polishing. It can be selected from a wide variety of materials according to the purpose of the polishing process. For example, in the case where the article to be polished is made of a material of a high degree of hardness, such as an ultrahard tool, a polishing material such as green silicon carbide (SiC) or diamond is suitable. For polishing articles of hard steels, special steels, high-speed steels, and the like, white fused alumina ($Al_2O_3$) is suitable, while chromic oxide ($Cr_2O_3$) is suitable for polishing articles made of soft materials. For final polishing of magnetic heads, ferric oxide ($Fe_2O_3$) is suitable. Polishing materials of a grain or particle size of 0.1 to 20 μm are suitable.

Examples of other polishing materials are silicon nitride, zirconium oxide, boron nitride, and emery. Furthermore, it is also possible to use particles and flakes of synthetic resins as polishing materials. Examples of such resins are:

(1) Linear polyamides that are condensates of a diamine, $NH_2(CH_2)_m NH_2$, and a dibasic acid, $HOOC(CH_2)_{n-2}COOH$, that is, m-n-nylon, more specifically, 6-6-nylon wherein m=6 and n=6, 6-10-nylon wherein m=6 and n=10, etc.;

(2) linear polyamides that are polycondensates or polymers of ω-amino acid, $H_2 N(CH_2)_n COOH$, or

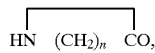

that is, n-nylon more specifically, 6-nylon wherein n=6, 11-nylon wherein n=11, etc.;

(3) acrylic resins such as polyacrylates, e.g., polymethyl acrylate, polyethyl acrylate, and polybutyl acrylate, and polymethacrylates, e.g., polymethyl methacrylate, polyethyl methacrylate, and polybutyl methacrylate.

(4) benzoguanamine (5) melamine resin

Polishing materials produced from these synthetic resins are suitable for polishing the surfaces of relatively soft articles such as synthetic resin products. Furthermore, such polishing materials can be used also for precision polishing requiring fine degrees of roughness.

In general, these synthetic resin polishing materials are superior to metals in their transmittances with respect to ultraviolet rays and visible light rays. Furthermore, their indices of refraction are close to those of ionizing radiation curable resins. For these reasons, they are suitable for setting by radiation with ultraviolet rays and visible light rays.

As a desirable mode for preventing the abrasive polishing particles from readily peeling off during polishing and utilizing with maximum effectiveness the hardness and polishing capability possessed originally by the polishing particles, there is a method of coating the surfaces of the polishing material particles with a functional group having chemical affinity and good wettability with respect to the ionizing radiation curable resin or causing chemical bonding thereof.

This method has already been disclosed in Japanese Patent Publication No. 16002/1993 as a process method with the object, in the production of light-diffusing plates (or films) by dispersing particles of a delusterant or delustering agent in a transparent synthetic resin, of obtaining uniformity of dispersion of the delusterant thereby to obtain uniformity of delustering and high light transmittance. In the development of this invention, it was found that this process method is effective also for preventing peeling off of the polishing material and for improving the polishing performance.

As a specific example, reference is made to Japanese Patent Publication No. 16002/1993, which discloses a process wherein, with the use of particles of a silicone resin (polysiloxane) comprising a three-dimensional-network high polymer as polishing (abrasive) particles, an alkyl group such as an ethyl group, a methyl group, a propyl group, or a butyl group, or an organic group such as a carboxyl group, a carbonyl group, an ester group, or an ether group is caused to bond to at least silicon atoms in the vicinity of the outer surfaces of the silicon resin particles, thereby exposing a portion of the organic group at the surfaces of the silicone resin particles. The number of this organic group is desirably 0.5 or more and less than 1.5 per 1 silicon atom. If this number is less than 0.5, the dispersibility and the effect of preventing peeling with be inadequate. If it exceeds 1.5, the density of the mesh of the polysiloxane bond will become coarse, and the capacity of the material as a polishing agent will be insufficient.

Another example of the above described method is that wherein a silane coupling agent is applied as a coating on the surfaces of polishing particles of silica, alumina, etc.

An even more desirable mode of procedure is that of dispersing, in an ionizing radiation curable resin, particles obtained by subjecting the surfaces of polishing material particles to a coating process with a silane coupling agent comprising alkoxysilane having a radical-polymerizable unsaturated group. This processing method also has already been disclosed in Japanese Patent Application Laid-Open Publn. No. 293099/1988 with the object stated therein of preventing blocking (preventing tackiness) of yet uncured coating film of resin of ionizing radiation curing type. According to the present invention, however, it was discovered that the instant processing method is effective in preventing the peeling off of the abrasive tape during polishing and in improving the polishing performance thereof.

Specifically, the silane coupling agent is an alkoxysilane having a radical-polymerizable unsaturated group, such as for example, γ-methacryloxypropyltrimethoxysilane, γ-methacryloxypropylmethyldimethoxysilane, γ-acryloxypropyltrimethoxysilane, γ-acryloxypropylmethyldimethoxysilane, and vinyltriethoxysilane.

As polishing materials for which processing with these (agents) is especially effective, alumina ($Al_2O_3$) and silica ($SiO_2$) can be mentioned, but, of course, there is no reason for limitation thereof to only these.

For coating processing a polishing material with the silane coupling agent, a method in which particles or grains of the polishing material are dispersed in a solvent such as toluene, and thereafter a specific quantity of the silane coupling agent is added to cause a reaction is desirable for carrying out the process uniformly.

When the polishing material particles thus processed are dispersed in a solution of the ionizing radiation curable resin and irradiated with ionizing radiation rays, the radical polymerizable unsaturated group in the silane coupling agent molecule cross links with a monomer, prepolymer, and/or oligomer in the solution of the ionizing radiation curable resin, polymerizes, and chemically bonds to the polishing material particles and the cured resin of the ionizing radiation curable resin, adhering strongly thereto.

Furthermore, depending on the use, it is also to use as the polishing layer a material produced by forming desired irregularities of concavities and convexities on the surface of the cross-linked cured material of the ionizing radiation curable resin solution without adding any polishing material whatsoever.

This polishing layer without a polishing material, also, is suitable for surface polishing and precision polishing of soft substances such as, for example, synthetic resins.

The decisions as to whether or not to use a polishing material and to the kind of the polishing material if used are suitably made in accordance with factors such as the required polishing performance, the article to be polished, curing conditions, coating conditions, and the case of forming the concavities and convexities.

In this connection, in the case where a polishing material is to be used, it is desirable that the content of the polishing material in the coating for forming the polishing layer be 50 to 1,400 parts by weight relative to 100 parts by weight of the binder component.

While the thickness of the polishing layer 10 is suitably set in accordance with the use, a thickness of the order of 0.5 to 500 μm is ordinarily suitable. Furthermore, in the case where the polishing layer 10 is required to have a high flexibility or resistance to shrinkage, the requirement can be met by adding into the above mentioned curing type resin a suitable quantity of a thermosetting resin such as, for example, non-reactive acrylic resin or various waxes. In addition, additives such as an antistatic agent can also be added as necessary to the polishing layer.

For the material of the polishing layer, a material containing as a predominant component a monomer, prepolymer, or oligomer having within its molecule two or more ethylenically unsaturated groups such as acryloyl groups or methacrylol groups or thiol groups as a binder is used. Examples are acrylates such as urethane acrylate, polyester acrylate, epoxy acrylate, trimethylolpropane triacrylate, and dipentaerythritol hexaacrylate; methacrylates such as urethane methacrylate, polyester methacrylate, epoxy methacrylate, trimethylolpropane trimethacrylate, and dipentaerythritol hexamethacrylate; thiols such as trimethylolpropane trithiopropylate and pentaerythritol tetrathioglycol; and unsaturated polyesters.

Other than these, a monomer, prepolymer, or oligomer having one or more of groups such as ethylenically unsaturated groups and thiol groups within the molecule can also be added. Examples are acrylates and methacrylates. The cross-link density of the set substance and further physical properties such as flexibility and heat resistance are adjusted by selecting the numbers of the functional groups, the molecular weights, the kinds, and other characteristics of the compounds to be compounded. In general, when a compound of a high molecular weight and a small number of functional groups is made the predominant component, the hardness becomes lower, the flexibility increases, and the heat resistance decreases; whereas when a compound of low molecular weight and a large number of functional groups is made the predominant component, the hardness becomes higher, the flexibility decreases, and the heat resistance increases. In all cases, after crosslinking curing, macromolecules of three-dimensional network structure are formed. Furthermore, in order to improve the adhesivity relative to the film substrate, a resin of non-crosslinked type such as a methacrylic resin, an acrylic resin, or a vinyl chloride-vinyl acetate copolymer can be added.

In the case of crosslinking and curing with ultraviolet rays or visible light rays, an acetophenone, a benzophenone, or the like is added as a photopolymerization initiator.

In general, in the case of a use for which a high degree of smoothness of the finished surface is required as in the finishing of a magnetic recording material, a magnetic head, or the like, a good result is obtained by using a relatively soft (low degree of hardness) polishing layer. As one criterion, it became clear as a result of experiments that, in the case of thermoplastic (saturated) polyester as the binder of the polishing layer, a substance of a glass transition point of 50° C. or lower, particularly 35° C. or lower, is desirable. The above mentioned hardness and flexibility of the set material of the ionizing radiation curable resin are also adjusted to an equivalent degree.

Specific examples are as follows.

An example of an ionizing radiation curing type resin solution composition which will produce a crosslink cured substance that is relatively flexible, pliant, yet tough is a composition obtained by mixing a substance having a hard segment and a soft segment in the monomer, prepolymer, or oligomer to become the polymerization unit. Upon being irradiated with ionizing radiation rays, these polymerization units mutually cross link and form a set substance. A specific example is a monomer, prepolymer, or oligomer of urethane acrylate. To this, for adjusting the crosslinking density and hardness of the set substance, acryl monomer is admixed.

For the above mentioned urethane acrylate, that of an average molecular weight of 500 to 50,000 is selected from those known heretofore.

As a specific example, an oligomer or a prepolymer of an urethane acrylate having an urethane group and a radical polymerizable unsaturated group in the molecule can be obtained by causing an isocyanate having two or more isocyanate groups, a polyester prepolymer of a weight average molecular weight of 200 to 3,000 having 1 to 4 hydroxyl groups in one molecule, and an acrylate compound having a hydroxyl group as a terminal group and moreover having a radical polymerizable unsaturated group to react in a solvent or not in a solvent in the presence of a reaction catalyst such as an amino or an organic tin compound and a polymerization inhibitor such as hydroquinone.

As isocyanates for constituting the above mentioned urethane acrylate, there are aliphatic or aromatic isocyanate compounds. Examples are isophoronediisocyanate and hexamethylenediisocyanate.

Examples of the polyester prepolymer having 1 to 4 hydroxyl groups in one molecule which constitutes the above mentioned urethane acrylate are: addition reaction products of diol compounds having aromatic or spiro-ring skeletons and lactone compounds or derivatives thereof or epoxy compounds; condensation products of polybasic acids such as phthalic acid and polyols such as ethylene glycol; polyester diols such as polyester compounds obtained by cleaving cyclic ester compounds; polyether diols such as polytetramethylene ether glycol, polyethylene glycol, and polypropylene glycol; and polycarbonate diols. These compounds are used singly or in a mixture of two or more members.

The weight average molecular weight of the polyester polymer having 1 to 4 hydroxyl groups in one molecule is desirably within a range of 200 to 3,000 from the standpoint of wear resistance and hardness, a range of 500 to 1,500 being particularly desirable.

Examples of acrylate compounds having a hydroxyl group at the end of each molecule and, moreover, having one or more radical polymerizable unsaturated groups are hydroxylation derivatives of (meth)acrylic acid ester such as hydroxyethyl acrylate and hydroxypropyl methacrylate and epoxy acrylate. Monomers of these (acrylates) are used.

In the case where a very high degree of smoothness of the finished surface is not required but, rather, it is necessary to increase the polishing rate, the binder is made relatively hard. As a tentative criterion, the hardness and flexibility are made to be of the same order as those of a thermoplastic polyester of a Tg of 50° C. or higher.

In order to prevent generation of static electricity during polishing, an antistatic agent is added. In this case, it is desirable to devise a measure for preventing the antistatic agent from migrating to the side of the article being polished as the polishing proceeds.

For example, a good result can be obtained by causing a preparation resulting from the addition of a surface active agent (anionic or nonionic) molecule to a monomer, prepolymer, or oligomer having an ethylenically unsaturated bond (acryloyl group, methacryloyl group, or the like) to undergo crosslinking together with the aforementioned ionizing radiation setting resin composition. An example of such a surface active agent is one having a structure represented by the following formula (sold on the market under the trademark of "Adekarea Soap" from Asahi Denka Kogyo K.K., Japan).

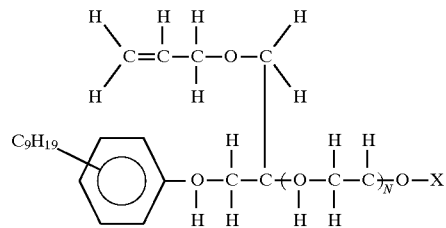

where X is H or $SO_3NH_4$.

The crosslinkable surface active agent undergoes crosslinking and curing together with the binder resin and, in the three-dimensional network macropolymer structure, chemically bonds by covalent bonding or the like, thereby to form an integral structure. As an example of chemical bonding of a surface active agent molecule to a three-dimensional network molecular structure formed by crosslinking or polymerization by ionizing radiation rays, a composition as disclosed in Japanese Patent Laid-Open Publication No. Heisei 5-98049 may be used.

This is a composition of a resin of ultraviolet-ray setting type comprising principally the following members (A), (B), (C), and (D) and used singly by itself or is a substance formed by dispersing particles of the polishing material in said composition.

(A) A monomer having a quaternary ammonium salt represented by the general formula

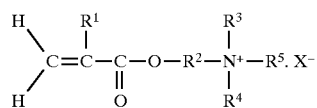

where:

$R^1$ represents a hydrogen atom or a methyl group; each of $R^3$, $R^4$, and $R^5$ represents independently a hydrogen atom or an alkyl group; $R^2$ represents an alkylene group or an oxyalkylene group; and $X^-$ represents a halogen ion, $R^6SO_3^-$ ($R^6$ being an alkyl group substituted aromatic group, alkoxy group), or $(R^7O)_2PO_2^-$ ($R^7$ being an alkyl group).

(B) A crosslinkable oligomer.

(C) A multifunctional acrylic ester and/or methacrylic ester of at least trifunctional character.

(D) A photopolymerization initiator.

As a separate example, graphite or metals such as, silver, copper, platinum, nickel, chromium, iron or ferrous alloys such as carbon steel and stainless steel, and aluminum or aluminum alloys such as duralumin in the form of powder or thin flakes are added to the polishing layer. In order to overcome problems such as impairment of the polishing characteristic and adherence to the article being polished, these (metal powders or flakes) can be added to the film substrate material.

For the film substrate 2, any kind of film can be used as long as it has been used from the past for polishing tapes and, moreover, has a suitable flexibility for its smooth passage of also rolls, etc., in the production process. For example, polyester film, polyethylene film, polypropylene film, polyvinyl chloride film, polyvinylidene chloride film, polycarbonate film, polyamide (nylon) film, polystyrene film, ethylene-vinyl acetate copolymer film, etc., can be used. Among these, when the points of ease of fabrication, strength, cost, etc., are considered, polyester films such as those of particularly biaxial orientated polyethylene terephthalate, polyethylene naphthalate, etc., are desirable. The surfaces of these films to form the polishing layer can be processed according to necessity by corona discharge treatment or by easily adhesive primer treatment with polyester resin, etc. Furthermore, other than the above described substrates, depending on the necessity, paper, fabric, non-woven fabric, synthetic paper, etc., which have been treated with a filler may be used. The thickness of this substrate 2 is desirably of the order of 12 to 100 $\mu$m. Further, these substrates may be of a single layer or be laminated with two or more layers.

According to the method of the present invention, an abrasive tape of constantly uniform and precise recessed part shape is obtained. At least the initial polishing capacity of this abrasive tape is stable. Furthermore, since the recessed parts are of specific shapes as described hereinbefore, the polishing debris produced from the article being polished during polishing is efficiently accommodated in these recessed parts. As a result, there is little risk of damaging the surface of the article being polished due to infiltration of polishing debris in between the abrasive tape and the article being polished. Furthermore, there is also no lowering of the polishing capacity due to clogging of the pores of the polishing layer. The abrasive tape is particularly optimally suitable for precision polishing such as that requiring mirror finishing. In addition, since the polishing layer is constituted of an ionizing radiation curing type resin which has been set, it has excellent physical properties such as wear resistance, whereby polishing by the polishing material is positively carried out, and there is little possibility of defective polishing of the article being polished, polishing of high precision becoming possible.

Specific examples of practice of the present invention will now be described.

EXAMPLE 1

On one surface of a polyester film (T-60, mfd. by Toray) of 25-$\mu$m thickness, a double-liquid curable type polyester primer was applied by the gravure coating method so as to form a coating of a thickness of 0.3 $\mu$m upon drying thereby to carry out mold release (lubrication) processing. On this thus-processed surface, a polishing layer was formed with the following constituent materials and under the following conditions by employing the production mode indicated in FIG. 1, thereby fabricating an abrasive tape.

Formplate—Use was made of a roll formplate with a concavity width of 10 $\mu$m, a plate depth (depth of concavity) of 15 $\mu$m, and a concavity pitch of 30 $\mu$m. Moreover the planar shape was that of a tortoise-shell with plate concavities of rectangular cross section form.

Ionizing radiation curing type resin—A polyester-acrylate, electron beam curing type paint containing 100 percent by weight of white fused alumina was used.

Irradiation conditions—Irradiation was carried out with an electron beam of 10×10$^6$ rad by means of an electron beam radiating apparatus of curtain-beam type.

The abrasive tape thus obtained had a polishing layer with recessed parts formed in accordance with the plate, of desired sharp shape, moreover with good reproducibility. By using this polishing tape, polishing of stainless steel (SUS-45C, JIS) of a centerline average roughness (JIS-B-0601, JIS) of 0.5 $\mu$m was carried out, whereupon a polishing finish of a centerline average roughness of 0.1 $\mu$m was obtained. At the same time, furthermore, the polishing debris was accommodated in the above mentioned recessed parts, and damaging (scoring, abrading, etc.) of the surface of the article being polished did not occur.

EXAMPLE 2

On one surface of a biaxially oriented polyester film (T-60, mfd. by Toray Kabushiki Kaisha) of 25-$\mu$m thickness, a double-liquid curing type polyester primer was applied by the gravure coating method so as to form a coating of a thickness of 0.3 $\mu$m upon drying thereby to carry out mold release (lubrication) processing. On this thus-processed surface, a polishing layer was formed with the following constituent materials and under the following conditions by employing the production mode indicated in FIG. 29, thus fabricating an abrasive tape.

Shape—A Bernard cell shape as shown in FIG. 21 was used.

Formplate—Use was made of a roll formplate with tortoise-shell shape grooved concavities of a width of 5 $\mu$m, plate depth (cell depth) of 10 $\mu$m, a diameter of 5 $\mu$m and depth of 3 $\mu$m of each pinhole in the center of each region divided by the tortoise-shell shape grooved concavities, and a surface form comprising a reversal of concavities and convexities with a pitch of tortoise-shell grooves of 100 $\mu$m. The material comprised a hollow iron cylinder and a copper-plated layer on the outer surface thereof, the concave-convex surface form being formed thereon.

Ionizing radiation curing type resin—An electron beam curing type paint comprising 600 parts by weight of alumina powder (WA-#8000, mfd. by Fujimi Kenmazai Kabushiki Kaisha) and 100 parts by weight of a multifunctional urethane acrylate prepolymer was used.

Irradiation conditions—Irradiation was carried out with an electron beam of 10×10$^6$ rad by means of an electron beam radiating apparatus of curtain-beam type. The interior hollow part of the roll formplate was water-cooled to maintain the outer surface temperature at 20° C.

The abrasive tape thus obtained had a polishing layer having recessed parts formed in accordance with the plate, of desired sharp shape, moreover with good reproducibility. By using this abrasive tape, polishing of the surface of a 5.25-inch magnetic floppy disc of a centerline average roughness of 0.5 $\mu$m was carried out, whereupon a polishing finish of a centerline average roughness of 0.05 $\mu$m was obtained. Furthermore, the polishing debris at this time was accommodated in the above mentioned recessed parts, and damaging of the surface of the article being polished due to the polishing debris did not occur.

EXAMPLE 3

On one surface of a biaxially-oriented polyester film (T-60, mfd. by Toray) of 25-$\mu$m thickness, a double-liquid curing type polyester primer was applied by the gravure coating so as to form a coating of a thickness of 0.3 $\mu$m upon drying thereby to carry out mold release processing. On this thus-processed surface, a polishing layer was formed with the following constituent materials and under the following conditions by employing the production mode indicated in FIG. 1, thus fabricating an abrasive tape.

Formplate—For the shape, a Bernard cell shape as shown in FIG. 21 was used. Use was made of a roll formplate with tortoise-shell shaped grooved concavities of a width of 1 $\mu$m, plate depth (concavity depth) of 2 $\mu$m, a diameter of 1 $\mu$m and depth of 1 $\mu$m of each pinhole in the center of each region divided by the tortoise-shell shape grooved concavities, and a surface form comprising a reversal of concavities and convexities with a pitch of tortoise-shell grooves of 80 $\mu$m. The material was the same as that in Example 2.

Ionizing radiation curing type resin—An electron beam curing type paint comprising 600 parts by weight of alumina powder (WA-#8000, mfd. by Fujimi Kenmazai Kabushiki Kaisha) and 100 parts by weight of a multifunctional urethane acrylate prepolymer was used.

Irradiation conditions—Irradiation was carried out with an electron beam of 10×10$^6$ rad by means of an electron beam radiating apparatus of curtain-beam type.

The abrasive tape thus obtained had a polishing layer having recessed parts formed in accordance with the plate, of desired sharp shape, moreover with good reproducibility. By using this polishing tape, polishing of the surface of a 5.25-inch magnetic floppy disc of a centerline average roughness of 0.40 $\mu$m was carried out, whereupon a polishing finish of a centerline average roughness of 0.09 $\mu$m was obtained. Furthermore, the polishing debris at this time was accommodated in the above mentioned recessed parts, and damaging of the surface of the article being polished due to the polishing debris did not occur.

INDUSTRIAL APPLICABILITY

The present invention is applicable to polishing for the purpose of high precision finishing of surfaces of articles such as floppy discs and magnetic heads and end faces of optical fibers.

We claim:

1. An abrasive tape comprising:

a film substrate;

a polishing layer laminated on one surface of said film substrate and having an outer surface provided with a plurality of mutually isolated, adjacent recessed parts, said polishing layer consisting essentially of an ionizing radiation curable resin in the cured state.

2. An abrasive tape according to claim 1, wherein said polishing layer has a three-dimensional network molecular structure in which surface-active agent molecules are chemically bonded.

* * * * *